(12) United States Patent
Kondo

(10) Patent No.: US 6,581,178 B1
(45) Date of Patent: Jun. 17, 2003

(54) ERROR CORRECTION CODING/DECODING METHOD AND APPARATUS

(75) Inventor: Takayuki Kondo, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/500,845

(22) Filed: Feb. 10, 2000

(30) Foreign Application Priority Data

Feb. 15, 1999 (JP) .......................................... 11-035717

(51) Int. Cl.⁷ .............................................. H03M 13/00
(52) U.S. Cl. ...................................................... 714/758
(58) Field of Search ................. 714/752, 755, 714/756, 758

(56) References Cited

U.S. PATENT DOCUMENTS

| | | | | |
|---|---|---|---|---|
| 4,276,646 A | * | 6/1981 | Haggard et al. ............. | 714/758 |
| 4,665,537 A | | 5/1987 | Moriyama | |
| 4,796,260 A | | 1/1989 | Schilling et al. | |
| 5,392,299 A | * | 2/1995 | Rhines et al. ............... | 714/756 |
| 5,696,774 A | * | 12/1997 | Inoue et al. ................. | 714/755 |
| 5,708,667 A | | 1/1998 | Hayashi | |
| 5,920,578 A | * | 7/1999 | Zook ........................... | 714/755 |
| 6,032,283 A | | 2/2000 | Meyer | |
| 6,119,260 A | * | 9/2000 | Tomisawa et al. ........... | 714/758 |
| 6,158,038 A | * | 12/2000 | Yamawaki et al. .......... | 714/755 |
| 6,216,245 B1 | * | 4/2001 | Noda ........................... | 714/755 |
| 6,311,304 B1 | * | 10/2001 | Kwon .......................... | 714/755 |

FOREIGN PATENT DOCUMENTS

| | | |
|---|---|---|
| FR | 2 751 810 A1 | 1/1998 |
| JP | 62-117424 | 5/1987 |
| JP | 64-47131 | 2/1989 |
| JP | 64-47132 | 2/1989 |
| JP | 4-120631 | 4/1992 |
| JP | 5-235906 | 9/1993 |
| JP | 5-347564 | 12/1993 |

OTHER PUBLICATIONS

R.M. Pyndiah, "Near–Optimum Decoding of Product Codes: Block Turbo Codes", IEEE Transactions on Communications, vol. 46, No. 8, (Aug. 1998), pp. 1003–1010.

* cited by examiner

*Primary Examiner*—Albert Decady
*Assistant Examiner*—Shelly A Chase
(74) *Attorney, Agent, or Firm*—Sughrue Mion, PLLC

(57) ABSTRACT

In an error correction coding method, continuous transmission data is segmented in units of predetermined lengths. The data are rearranged parallelly. Error correction coding processing is performed for each of horizontal line blocks and vertical line blocks of the rearranged transmission data. An error correction coding apparatus is also disclosed.

32 Claims, 20 Drawing Sheets

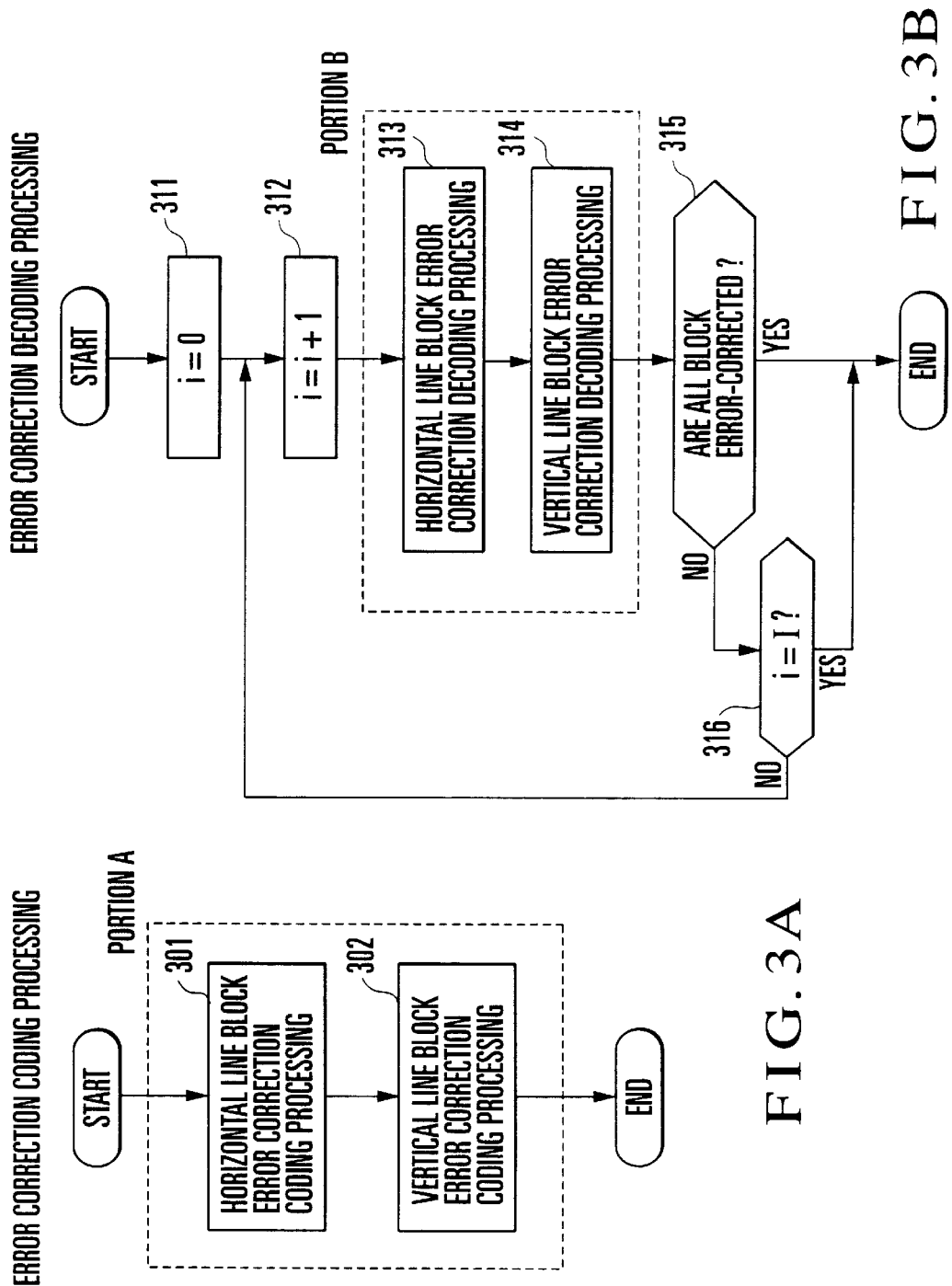

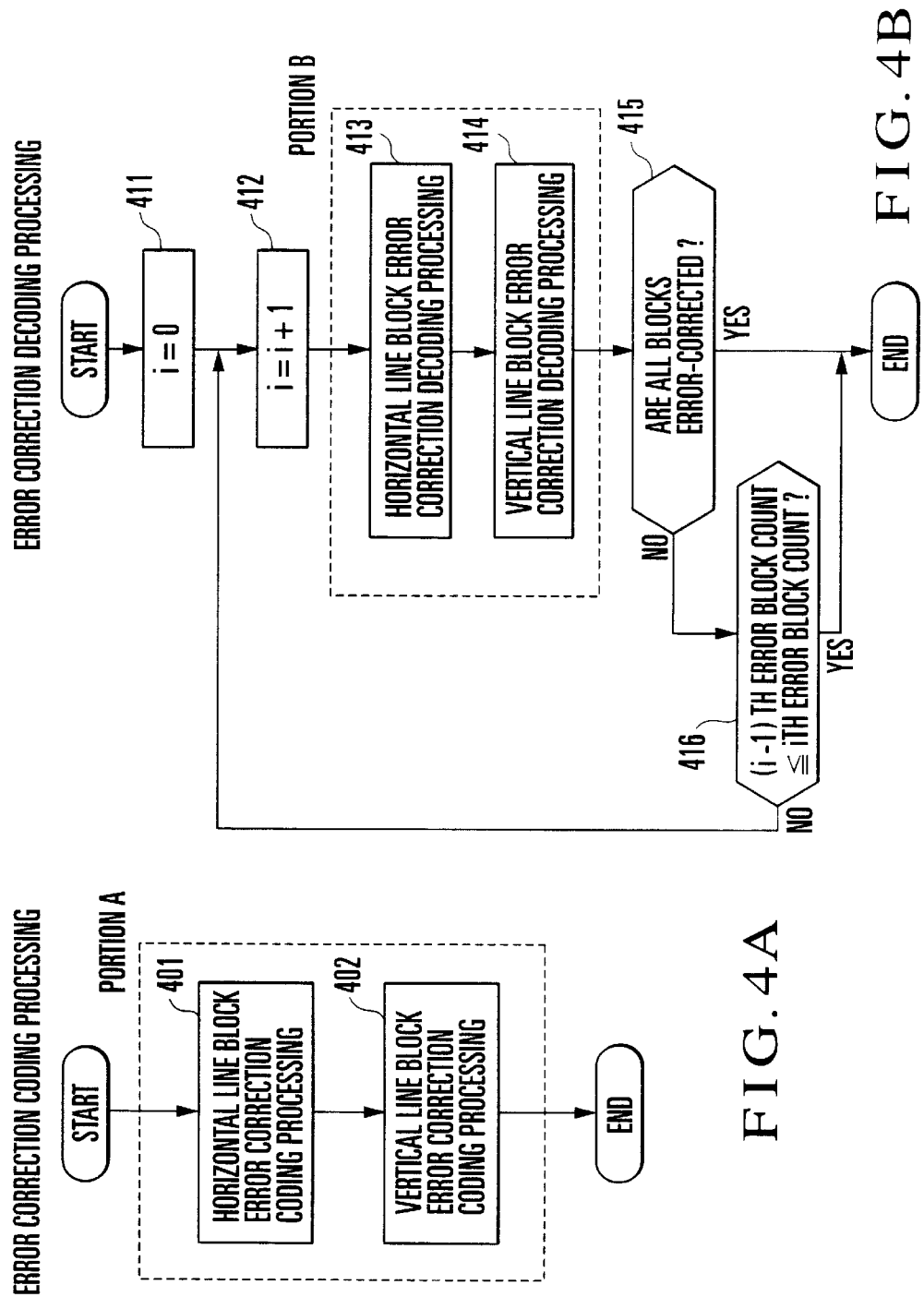

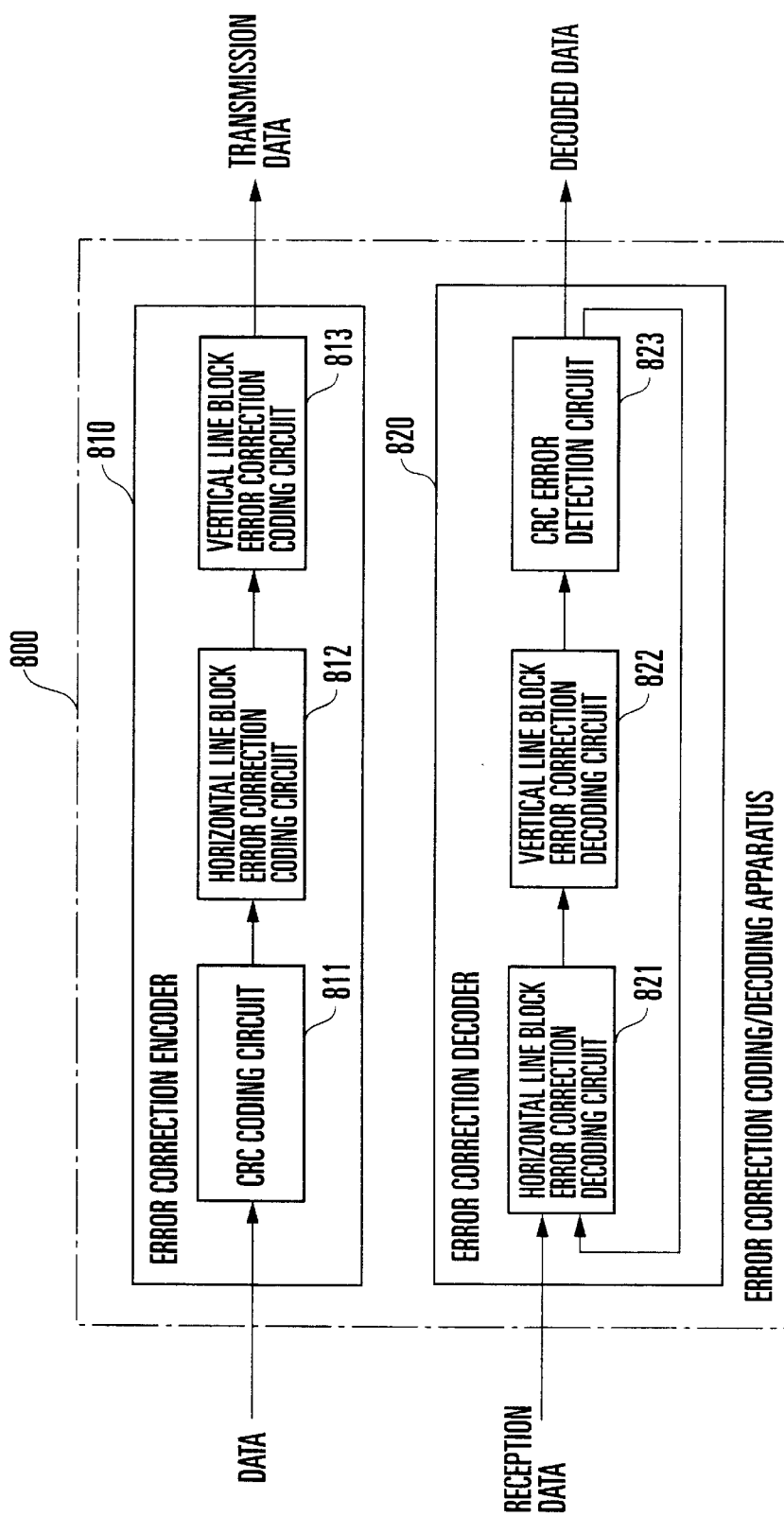

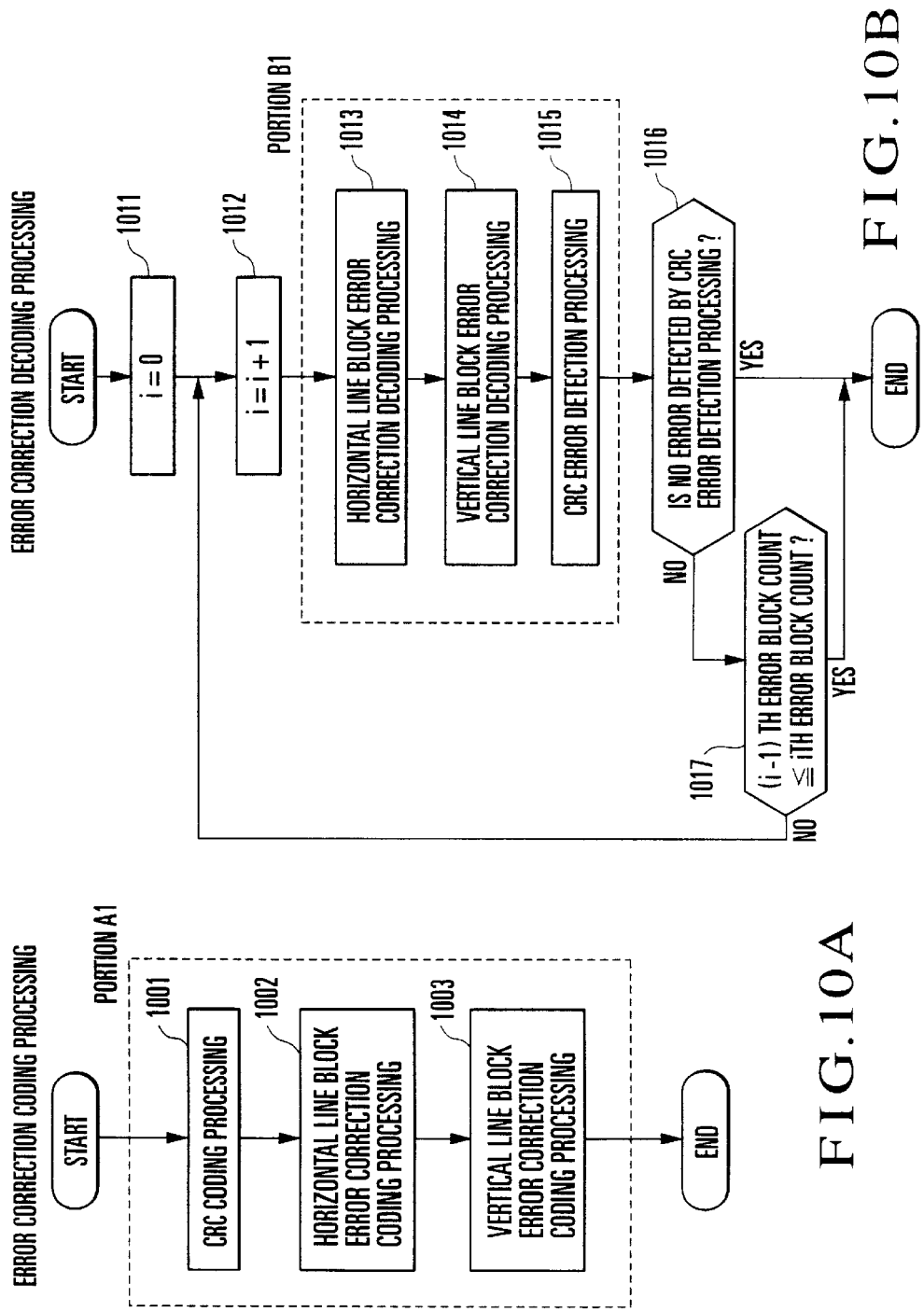

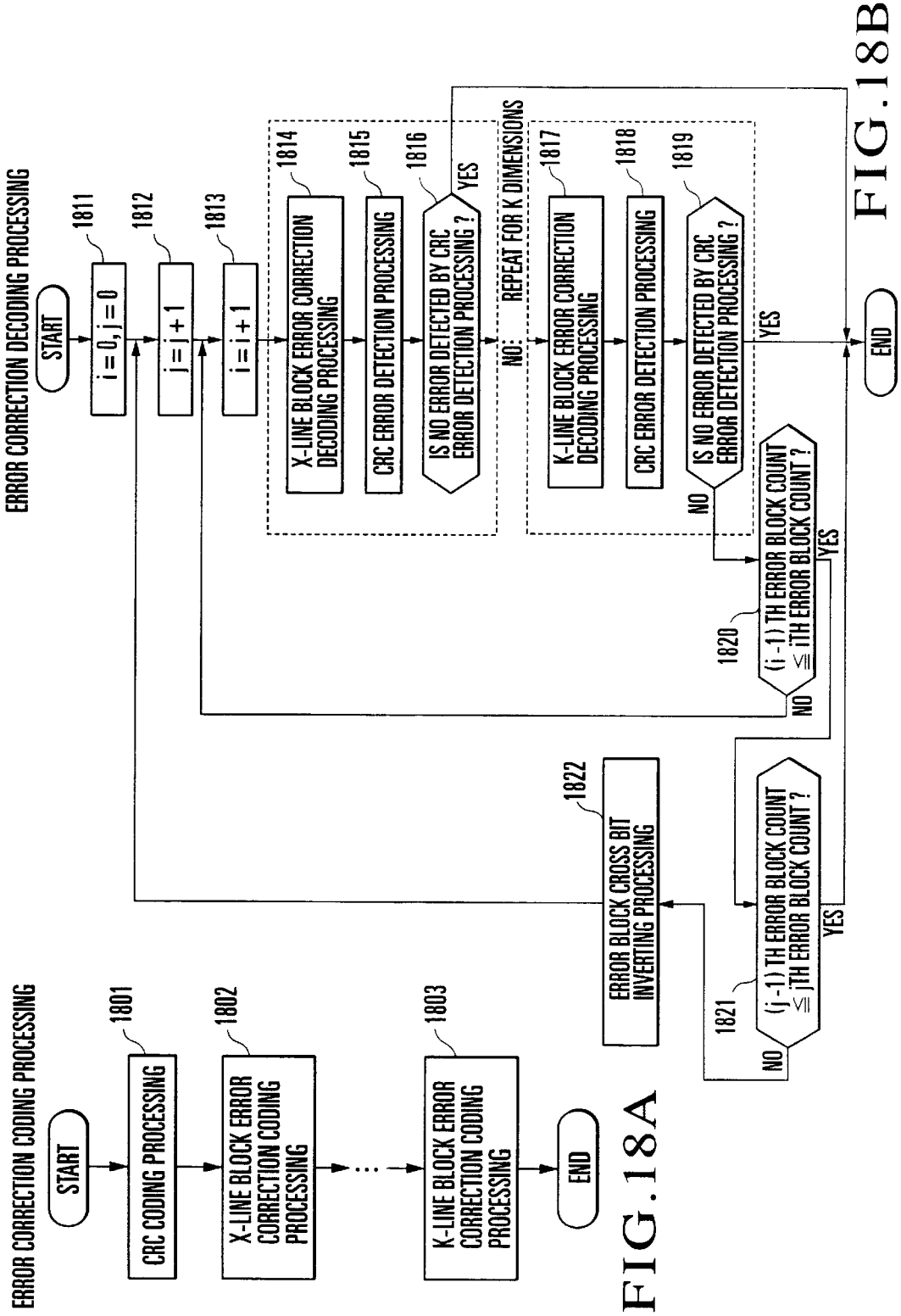

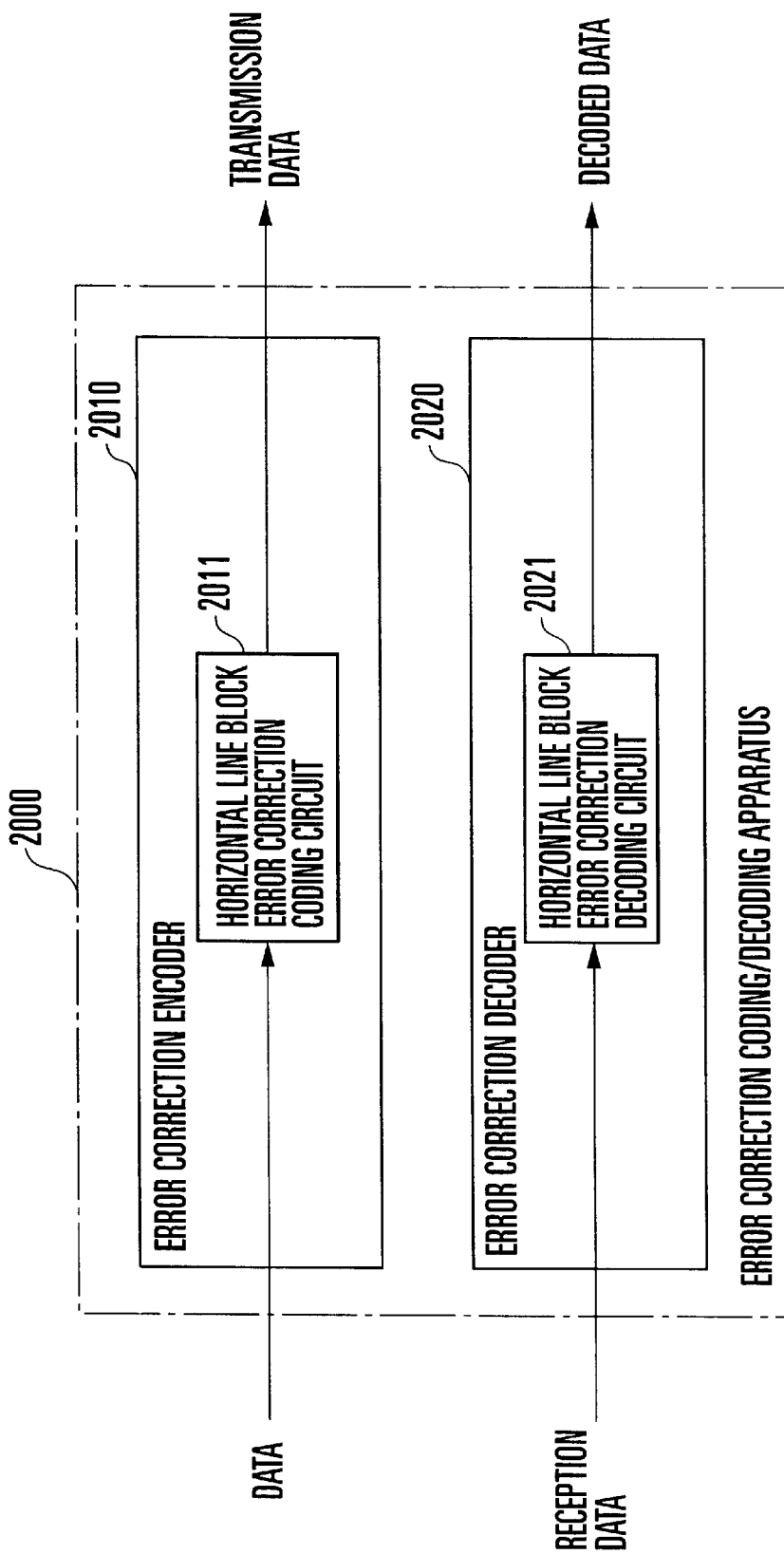
PRIOR ART FIG.20

ERROR CORRECTION CODING/DECODING METHOD AND APPARATUS

BACKGROUND OF THE INVENTION

The present invention relates to an error correction coding/decoding method and apparatus.

Conventionally, in data transmission by a digital communication system or data storage by a digital storage device, error correction coding and decoding are performed to detect a data error from an error-correcting code (also called a redundant code) and correct the error to improve the reliability. As the error-correcting code, a multidimensional code such as a Hamming code, BCH (Bose-Chaudhuri-Hocquenghem) code, or Reed-Solomon code is known. The multidimensional code is originally has a plurality of bits, and allows correct burst error correction or byte error correction.

FIG. 20 shows the arrangement of a conventional error correction coding/decoding apparatus. In an error correction coding/decoding apparatus 2000, a horizontal line block in transmission data is subjected to error correction coding by a horizontal line block error correction coding circuit 2011 of an error correction encoder 2010 and output (transmission data). Reception data is input to a horizontal line block error correction decoding circuit 2021 of an error correction decoder 2020, subjected to error correction decoding for a horizontal line block, and then output (decoded data).

In error correction by horizontal line block coding for a BCH code which allows 2-bit error correction, if a horizontal line block has errors in number larger than 2 bits, the errors cannot be corrected. For example, when information bits (49 bits) are represented using a BCH code capable of 2-bit error correction, and a given coded block (coded block 1) has errors of 3 bits or more, as shown in Table 1, the errors cannot be corrected.

TABLE 1

| Coded Block Number | Information Bits (49 bits) Check Bits (56 bits) |
| --- | --- |
| Coded Block 1 | XXX○○○○ + ○○○○○○○○ |
| Coded Block 2 | ○○○○○○○ + ○○○○○○○○ |
| Coded Block 3 | ○○○○○○○ + ○○○○○○○○ |
| Coded Block 4 | ○○○○○○○ + ○○○○○○○○ |
| Coded Block 5 | ○○○○○○○ + ○○○○○○○○ |
| Coded Block 6 | ○○○○○○○ + ○○○○○○○○ |
| Coded Block 7 | ○○○○○○○ + ○○○○○○○○ |

For such error correction processing, various proposals for improvement have been made. For example, Japanese Patent Laid-Open No. 5-235906 discloses a "decoder for multidimensional code and error correction detection system using decoder" in which in decoding a multidimensional code, the highest bit likelihood in a symbol is used as the largest length to eliminate an error symbol at a high probability.

Japanese Patent Laid-Open No. 5-347564 discloses an error correction coding/decoding method and device and error correction decoding device using error correction using a block code. In this case, a punctured code is used at a coding rate higher than that of an original code, and high system compatibility is obtained.

Japanese Patent Publication No. 7-99503 discloses an "error correction method for coded data" in which for data subjected to triple error correction coding, error correction using a second code is reduced, and the correction ability for the third code is improved to obtain a higher correction ability even when a burst error is mixed.

However, in these prior arts, for, e.g., a BCH code capable of 2-bit error correction, if errors of 3 bits or more are present in a horizontal line block, the errors cannot be corrected.

SUMMARY OF THE INVENTION

The present invention has been made to solve the problems of prior arts, and has as its object to enable correction of an error pattern that cannot be corrected by a conventional arrangement. It is another object of the present invention to improve the error correction probability and allow high-speed decoding processing.

In order to achieve the above object, according to an aspect of the present invention, there is provided an error correction coding method comprising segmenting continuous transmission data in units of predetermined lengths, rearranging the data parallelly, and performing error correction coding processing for each of horizontal line blocks and vertical line blocks of the rearranged transmission data.

BRIEF DESCRIPTION OF THE DRAWINGS

FIG. 3A is a flow chart showing error correction coding processing according to the first embodiment;

FIG. 3B is a flow chart showing error correction decoding processing according to the first embodiment;

FIG. 4A is a flow chart showing error correction coding processing according to the first embodiment;

FIG. 4B is a flow chart showing error correction decoding processing according to the first embodiment;

FIG. 8 is a block diagram showing the fourth embodiment (K=2) of the present invention;

FIG. 10A is a flow chart showing error correction coding processing according to the fourth embodiment (K=2);

FIG. 10B is a flow chart showing error correction decoding processing according to the fourth embodiment (K=2);

FIG. 18A is a flow chart showing error correction coding processing according to the sixth embodiment;

FIG. 18B is a flow chart showing error correction decoding processing according to the sixth embodiment;

FIG. 20 is a block diagram showing a prior art.

DESCRIPTION OF THE PREFERRED EMBODIMENTS

Embodiments of the error correction coding/decoding method and apparatus of the present invention will be described next with reference to the accompanying drawings.

First Embodiment

Figure 1:
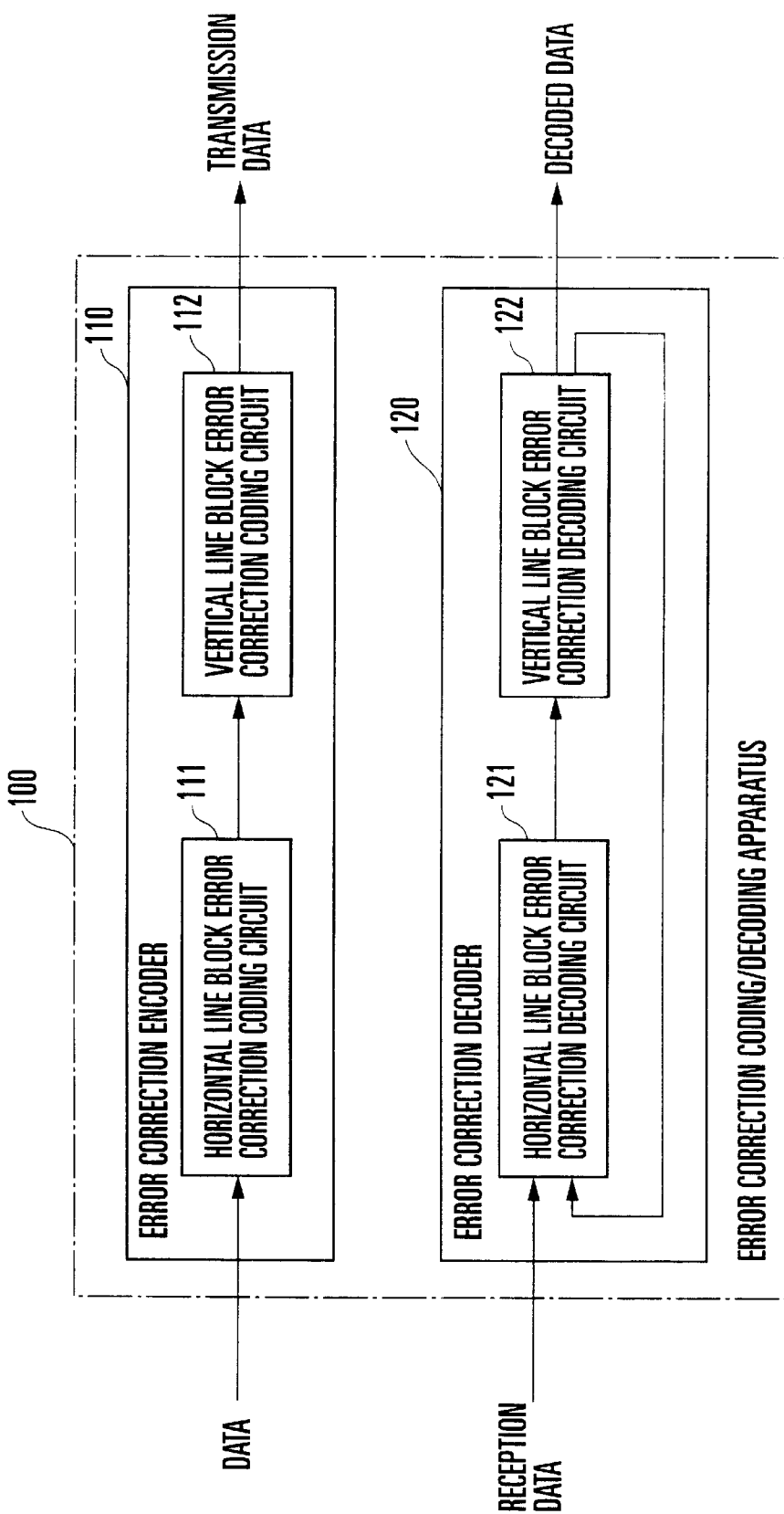
FIG. 1 is a block diagram showing the first embodiment of the present invention.

FIG. 1 shows the first embodiment of the present invention. Referring to FIG. 1, an error correction coding/decoding apparatus 100 has an error correction encoder 110 and error correction decoder 120. The error correction encoder 110 is a circuit on the transmitting side, which performs double block error coding of BCH codes for horizontal line blocks and vertical line blocks in which transmission data is rearranged parallelly (e.g., rectangularly) in the horizontal direction, and sends the information bits and check bits as transmission data. The error correction decoder 120 is a circuit on the receiving side, which rearranges reception data parallelly (rectangularly) in the horizontal direction and alternately performs error correction processing for the vertical line blocks and horizontal line blocks of the rearranged data.

The error correction encoder 110 on the transmitting side has a horizontal line block error correction coding circuit 111 and vertical line block error correction coding circuit 112. These circuits arrange transmission data D to be transmitted on horizontal line blocks and vertical line blocks that are rearranged parallelly in the horizontal direction, perform block error correction coding for the horizontal line blocks and vertical line blocks, and send transmission data added with a check bit E (1 bit).

The error correction decoder 120 on the receiving side has a horizontal line block error correction decoding circuit 121 and vertical line block error correction decoding circuit 122. As on the transmitting side, these circuits repeatedly perform error correction a plurality of number of times for the horizontal line blocks and vertical line blocks in which reception data is rearranged parallelly in the horizontal direction to generate decoded data, and sends the generated decoded data.

A specific operation of this first embodiment will be described next.

Figure 2A:
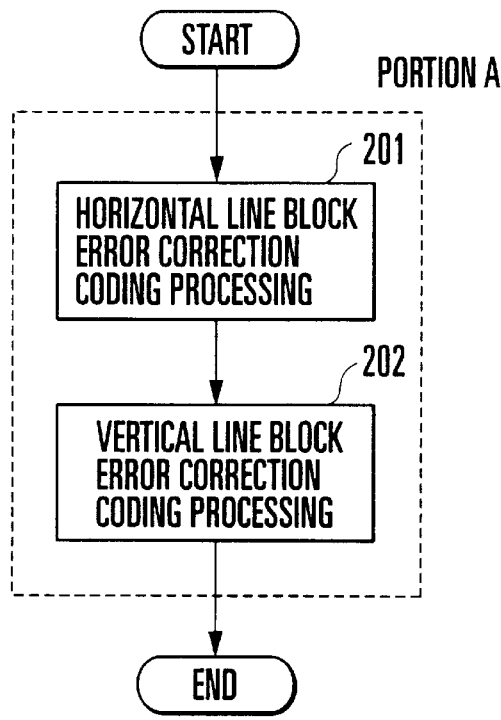
FIG. 2A is a flow chart showing error correction coding processing according to the first embodiment.

FIG. 2A shows error correction coding processing.

In transmission, the horizontal line block error correction coding circuit 111 and vertical line block error correction coding circuit 112 of the error correction encoder 110 on the transmitting side arrange information bits D ($D_0$, $D_1$, $D_2$, $D_3$, ..., $D_{n-1}$; the number of bits is n) in horizontal line blocks and vertical line blocks in which the information bits are rearranged parallelly in the horizontal direction as shown in Table 2 (steps 201 and 202). If the number of bits has a shortage, and the data cannot be arranged rectangularly, dummy bits for compensating the shortage of the number of bits are inserted. The value of each dummy bit is determined at "0" or "1" in advance. The horizontal line blocks and vertical line blocks shown in Table 2 are alternately subjected block error correction coding, and transmission data added with check bits shown in Table 3 is sent. A check bit E1 is added to a horizontal line block, and a check bit E2 is added to a vertical line block.

TABLE 2

|  | Vertical 0 | Vertical 1 | Vertical 2 | ... | Vertical m − 1 |
|---|---|---|---|---|---|
| Horizontal 0 | $D_0$ | $D_1$ | $D_2$ | ... | $D_{m-1}$ |
| Horizontal 1 | $D_m$ | $D_{m+1}$ | $D_{m+2}$ | ... | $D_{2m-1}$ |
| Horizontal 2 | $D_{2m}$ | $D_{2m+1}$ | $D_{2m+2}$ | ... | $D_{3m-1}$ |
| . | . | . | . |  | . |
| . | . | . | . |  | . |
| . | . | . | . |  | . |
| Horizontal n/m-1 | $D_{n-m}$ | $D_{n-m+1}$ | $D_{n-m+2}$ | ... | $D_{n-1}$ |

TABLE 3

|  | Vertical 0 | Vertical 1 | Vertical 2 | ... | Vertical m − 1 | Vertical m | Vertical m + 1 | ... | Vertical m + k − 1 |
|---|---|---|---|---|---|---|---|---|---|
| Horizontal 0 | $D_0$ | $D_1$ | $D_2$ | ... | $D_{m-1}$ | $E1_{0,0}$ | $E1_{0,1}$ | ... | $E1_{0,k-1}$ |
| Horizontal 1 | $D_m$ | $D_{m+1}$ | $D_{m+2}$ | ... | $D_{2m-1}$ | $E1_{1,0}$ | $E1_{1,1}$ | ... | $E1_{1,k-1}$ |
| Horizontal 2 | $D_{2m}$ | $D_{2m+1}$ | $D_{2m+2}$ | ... | $D_{3m-1}$ | $E1_{2,0}$ | $E1_{2,1}$ | ... | $E1_{2,k-1}$ |
| . | . | . | . |  | . | . | . |  | . |
| . | . | . | . |  | . | . | . |  | . |
| . | . | . | . |  | . | . | . |  | . |
| Horizontal n/m − 1 | $D_{n-m}$ | $D_{n-m+1}$ | $D_{n-m+2}$ | ... | $D_{n-1}$ | $E1_{n/m-1,0}$ | $E1_{n/m-1,1}$ | ... | $E1_{n/m-1,k-1}$ |
| Horizontal n/m | $E2_{0,0}$ |  | ... | $E2_{0,m-1}$ |  |  |  |  |  |
| Horizontal n/m + 1 | $E2_{1,0}$ |  | ... | $E2_{1,m-1}$ |  |  |  |  |  |
| . | . |  |  | . |  |  |  |  |  |
| . | . |  |  | . |  |  |  |  |  |
| . | . |  |  | . |  |  |  |  |  |
| Horizontal n/m + k − 1 | $E2_{k-1,0}$ |  | ... | $E2_{k-1,m-1}$ |  |  |  |  |  |

Figure 2B:
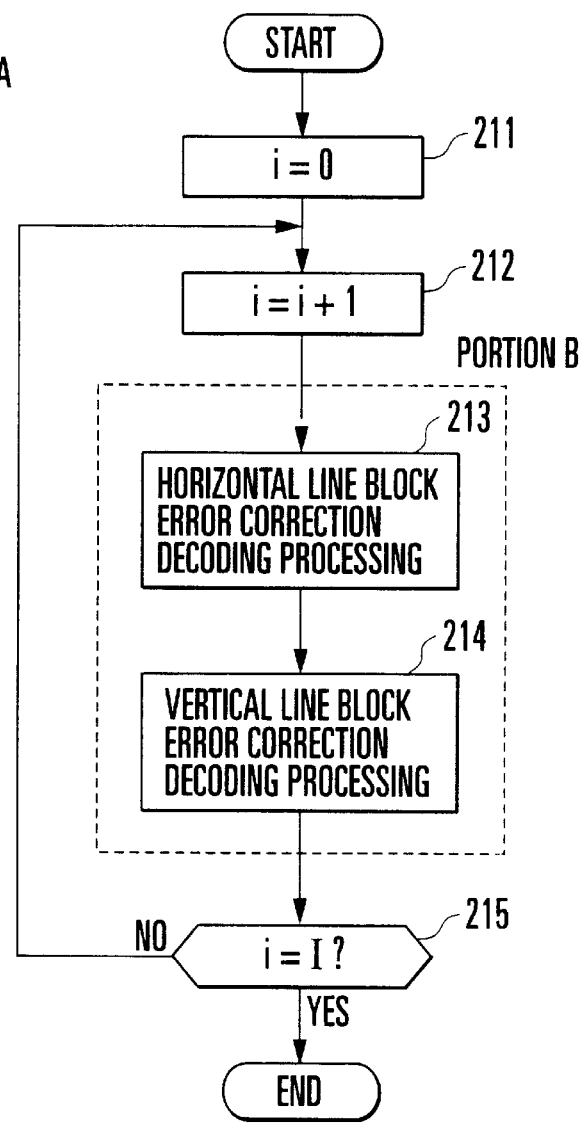
FIG. 2B is a flow chart showing error correction decoding processing according to the first embodiment.

FIG. 2B shows error correction decoding processing.

The horizontal line block error correction decoding circuit 121 and vertical line block error correction decoding circuit 122 of the error correction decoder 120 on the receiving side rearrange reception data parallelly in the horizontal direction, as on the transmitting side. Next, "0" is substituted into a variable i representing the error correction decoding processing execution count (step 211), and "1" is added to the variable i to perform decoding processing (step 212). More specifically, error correction of horizontal line blocks is performed sequentially from horizontal line 0 to horizontal line n/m−1 (step 213), and error correction of vertical line blocks is performed sequentially from vertical line 0 to vertical line m−1 (step 214). Steps 212 to 214 are repeated until the variable i reaches a predetermined processing count I (step 215).

Error correction coding processing and decoding processing of the present invention are not limited to those shown in FIGS. 2A and 2B. The following processing i) and ii) may be performed.

i) As shown in FIG. 3A, error correction coding processing is performed, as in FIG. 2A.
   FIG. 3B shows a modification of error correction decoding processing. Processing in steps 311 to 314 is performed as in FIG. 2B. The following step is added as final determination. More specifically, every time error correction decoding processing of horizontal lines and vertical lines is ended, it is determined whether all blocks of horizontal lines and vertical lines could be corrected (step 315). If YES in step 315, the processing is ended. If NO in step 315, it is determined whether the variable i has reached the predetermined processing count I (step 316).
   Determination whether errors are corrected is done on the basis of the value of syndrome obtained in error correction processing of horizontal line and vertical line blocks.
   ii) As shown in FIG. 4A, error correction coding processing is performed as in FIG. 3A.
   FIG. 4B shows a modification of error correction decoding processing. Processing in steps 411 to 415 is performed as in FIG. 3B. If all blocks are not error-corrected, step 416 is executed. More specifically, the total number of blocks for which error correction cannot be performed in the horizontal lines and vertical lines is obtained every time. When the total number of this time (ith time) is equal to or larger than that of preceding time ((i−1)th time), it is determined that error correction cannot be performed anymore, and processing is ended.

The operation of the first embodiment will be described next using a specific example. The above-described processing count I is set at "3".

Error Correction Coding Processing (1) First, information bits (○; a total of 49 bits) are rearranged to 7×7 parallelly (rectangularly) in the horizontal direction, as shown in Table 4.

TABLE 4

|  | Vertical 0 | Vertical 1 | Vertical 2 | Vertical 3 | Vertical 4 | Vertical 5 | Vertical 6 |
|---|---|---|---|---|---|---|---|
| Horizontal 0 | ○ | ○ | ○ | ○ | ○ | ○ | ○ |
| Horizontal 1 | ○ | ○ | ○ | ○ | ○ | ○ | ○ |
| Horizontal 2 | ○ | ○ | ○ | ○ | ○ | ○ | ○ |
| Horizontal 3 | ○ | ○ | ○ | ○ | ○ | ○ | ○ |
| Horizontal 4 | ○ | ○ | ○ | ○ | ○ | ○ | ○ |
| Horizontal 5 | ○ | ○ | ○ | ○ | ○ | ○ | ○ |
| Horizontal 6 | ○ | ○ | ○ | ○ | ○ | ○ | ○ |

(2) For the rearranged bit group, check bits shown in Table 5 are added to the horizontal line blocks.

TABLE 5

|  | Vertical 0 | Vertical 1 | Vertical 2 | Vertical 3 | Vertical 4 | Vertical 5 | Vertical 6 | Horizontal Line Check Bit | | |
|---|---|---|---|---|---|---|---|---|---|---|
| Horizontal 0 | ○ | ○ | ○ | ○ | ○ | ○ | ○ | ○ | ○ | ○ |
| Horizontal 1 | ○ | ○ | ○ | ○ | ○ | ○ | ○ | ○ | ○ | ○ |
| Horizontal 2 | ○ | ○ | ○ | ○ | ○ | ○ | ○ | ○ | ○ | ○ |
| Horizontal 3 | ○ | ○ | ○ | ○ | ○ | ○ | ○ | ○ | ○ | ○ |
| Horizontal 4 | ○ | ○ | ○ | ○ | ○ | ○ | ○ | ○ | ○ | ○ |
| Horizontal 5 | ○ | ○ | ○ | ○ | ○ | ○ | ○ | ○ | ○ | ○ |
| Horizontal 6 | ○ | ○ | ○ | ○ | ○ | ○ | ○ | ○ | ○ | ○ |

(3) Check bits shown in Table 6 are added to the vertical line blocks.

TABLE 6

|  | Vertical 0 | Vertical 1 | Vertical 2 | Vertical 3 | Vertical 4 | Vertical 5 | Vertical 6 | Horizontal Line Check Bit | | |
|---|---|---|---|---|---|---|---|---|---|---|
| Horizontal 0 | ○ | ○ | ○ | ○ | ○ | ○ | ○ | ○ | ○ | ○ |
| Horizontal 1 | ○ | ○ | ○ | ○ | ○ | ○ | ○ | ○ | ○ | ○ |
| Horizontal 2 | ○ | ○ | ○ | ○ | ○ | ○ | ○ | ○ | ○ | ○ |
| Horizontal 3 | ○ | ○ | ○ | ○ | ○ | ○ | ○ | ○ | ○ | ○ |
| Horizontal 4 | ○ | ○ | ○ | ○ | ○ | ○ | ○ | ○ | ○ | ○ |
| Horizontal 5 | ○ | ○ | ○ | ○ | ○ | ○ | ○ | ○ | ○ | ○ |
| Horizontal 6 | ○ | ○ | ○ | ○ | ○ | ○ | ○ | ○ | ○ | ○ |
| Vertical Line Check Bit | ○○○○ | ○○○○ | ○○○○ | ○○○○ | ○○○○ | ○○○○ | ○○○○ | | | |

The error correction coding processing is ended.

Error Correction Decoding Processing (1) The above-described coded data is received. Assume that data as shown in Table 7 is received. ○ represents a normal bit, and × represents a bit with an error.

First, the variable i representing the error correction decoding processing execution count is initialized to "0".

TABLE 7

|  | Vertical 0 | Vertical 1 | Vertical 2 | Vertical 3 | Vertical 4 | Vertical 5 | Vertical 6 | Horizontal Line Check Bit | | |
|---|---|---|---|---|---|---|---|---|---|---|
| Horizontal 0 | × | × | × | × | × | × | × | × | ○ | ○ | ○ |
| Horizontal 1 | × | ○ | ○ | ○ | ○ | ○ | ○ | ○ | ○ | ○ | ○ |
| Horizontal 2 | × | ○ | ○ | ○ | ○ | ○ | ○ | ○ | ○ | ○ | ○ |
| Horizontal 3 | × | ○ | ○ | ○ | ○ | ○ | ○ | ○ | ○ | ○ | ○ |
| Horizontal 4 | × | ○ | ○ | ○ | ○ | ○ | ○ | ○ | ○ | ○ | ○ |
| Horizontal 5 | × | ○ | ○ | ○ | ○ | ○ | ○ | ○ | ○ | ○ | ○ |
| Horizontal 6 | × | ○ | ○ | ○ | ○ | ○ | ○ | ○ | ○ | ○ | ○ |
| Vertical Line Check Bit | ○○○○ | ○○○○ | ○○○○ | ○○○○ | ○○○○ | ○○○○ | ○○○○ | | | |

(2) Error correction of horizontal line blocks 0 to 6 is performed. However, since horizontal line block 0 has errors beyond the correctable number (in this case, 1 bit can be corrected), horizontal line block 0 cannot be error-corrected at this time. Each of horizontal line blocks 1 to 6 has an error of 1 bit. These errors can be corrected, and the result shown in Table 7 is obtained. ⊙ is an error-corrected bit. After that, "1" is added to the variable i.

TABLE 8

| | Vertical 0 | Vertical 1 | Vertical 2 | Vertical 3 | Vertical 4 | Vertical 5 | Vertical 6 | Horizontal Line Check Bit | | | |
|---|---|---|---|---|---|---|---|---|---|---|---|
| Horizontal 0 | × | × | × | × | × | × | × | × | ○ | ○ | ○ |
| Horizontal 1 | ◎ | ○ | ○ | ○ | ○ | ○ | ○ | ○ | ○ | ○ | ○ |
| Horizontal 2 | ◎ | ○ | ○ | ○ | ○ | ○ | ○ | ○ | ○ | ○ | ○ |
| Horizontal 3 | ◎ | ○ | ○ | ○ | ○ | ○ | ○ | ○ | ○ | ○ | ○ |
| Horizontal 4 | ◎ | ○ | ○ | ○ | ○ | ○ | ○ | ○ | ○ | ○ | ○ |
| Horizontal 5 | ◎ | ○ | ○ | ○ | ○ | ○ | ○ | ○ | ○ | ○ | ○ |
| Horizontal 6 | ◎ | ○ | ○ | ○ | ○ | ○ | ○ | ○ | ○ | ○ | ○ |
| Vertical Line Check Bit | ○ | ○ | ○ | ○ | ○ | ○ | ○ | | | | |
| | ○ | ○ | ○ | ○ | ○ | ○ | ○ | | | | |
| | ○ | ○ | ○ | ○ | ○ | ○ | ○ | | | | |
| | ○ | ○ | ○ | ○ | ○ | ○ | ○ | | | | |

(3) Vertical line blocks 0 to 6 are error-corrected, and the result shown in Table 9 is obtained.

TABLE 9

| | Vertical 0 | Vertical 1 | Vertical 2 | Vertical 3 | Vertical 4 | Vertical 5 | Vertical 6 | Horizontal Line Check Bit | | | |
|---|---|---|---|---|---|---|---|---|---|---|---|
| Horizontal 0 | ◎ | ◎ | ◎ | ◎ | ◎ | ◎ | ◎ | × | ○ | ○ | ○ |
| Horizontal 1 | ◎ | ○ | ○ | ○ | ○ | ○ | ○ | ○ | ○ | ○ | ○ |
| Horizontal 2 | ◎ | ○ | ○ | ○ | ○ | ○ | ○ | ○ | ○ | ○ | ○ |
| Horizontal 3 | ◎ | ○ | ○ | ○ | ○ | ○ | ○ | ○ | ○ | ○ | ○ |
| Horizontal 4 | ◎ | ○ | ○ | ○ | ○ | ○ | ○ | ○ | ○ | ○ | ○ |
| Horizontal 5 | ◎ | ○ | ○ | ○ | ○ | ○ | ○ | ○ | ○ | ○ | ○ |
| Horizontal 6 | ◎ | ○ | ○ | ○ | ○ | ○ | ○ | ○ | ○ | ○ | ○ |
| Vertical Line Check Bit | ○ | ○ | ○ | ○ | ○ | ○ | ○ | | | | |
| | ○ | ○ | ○ | ○ | ○ | ○ | ○ | | | | |
| | ○ | ○ | ○ | ○ | ○ | ○ | ○ | | | | |
| | ○ | ○ | ○ | ○ | ○ | ○ | ○ | | | | |

(4) It is determined whether all horizontal line blocks and vertical line blocks are error-corrected. That is, it is determined whether the variable i has reached the error correction decoding processing count I (=3). In this case, horizontal line block 0 is corrected finally, and the result shown in Table 10 is obtained.

TABLE 10

| | Vertical 0 | Vertical 1 | Vertical 2 | Vertical 3 | Vertical 4 | Vertical 5 | Vertical 6 | Horizontal Line Check Bit | | | |
|---|---|---|---|---|---|---|---|---|---|---|---|
| Horizontal 0 | ◎ | ◎ | ◎ | ◎ | ◎ | ◎ | ◎ | ◎ | ○ | ○ | ○ |
| Horizontal 1 | ◎ | ○ | ○ | ○ | ○ | ○ | ○ | ○ | ○ | ○ | ○ |

TABLE 10-continued

|  | Vertical 0 | Vertical 1 | Vertical 2 | Vertical 3 | Vertical 4 | Vertical 5 | Vertical 6 | Horizontal Line Check Bit | | | |
|---|---|---|---|---|---|---|---|---|---|---|---|
| Horizontal 2 | ⊙ | ○ | ○ | ○ | ○ | ○ | ○ | ○ | ○ | ○ | ○ |
| Horizontal 3 | ⊙ | ○ | ○ | ○ | ○ | ○ | ○ | ○ | ○ | ○ | ○ |
| Horizontal 4 | ⊙ | ○ | ○ | ○ | ○ | ○ | ○ | ○ | ○ | ○ | ○ |
| Horizontal 5 | ⊙ | ○ | ○ | ○ | ○ | ○ | ○ | ○ | ○ | ○ | ○ |
| Horizontal 6 | ⊙ | ○ | ○ | ○ | ○ | ○ | ○ | ○ | ○ | ○ | ○ |
| Vertical Line Check Bit | ○○○○ | ○○○○ | ○○○○ | ○○○○ | ○○○○ | ○○○○ | ○○○○ | | | | |

The total number of check bits in the above example is 56 bits. This equals the maximum error-correctable bits (7×2 bits=14 bits) when BCH codes capable of 2-bit error correction are used under the same condition (information bits (49 bits), check bits (56 bits)) in the prior art.

Second Embodiment

The second embodiment will be described next. The apparatus of the second embodiment has the same arrangement as that of the first embodiment shown in FIG. 1. An error correction encoder 110 (horizontal line block error correction coding circuit 111 and vertical line block error correction coding circuit 112) on the transmitting side and an error correction decoder 120 (horizontal line block error correction decoding circuit 121 and vertical line block error correction decoding circuit 122) on the receiving side perform operation (coding/decoding) of the second embodiment (to be described below).

The operation of the second embodiment will be described. In the second embodiment, the check bits of horizontal line blocks are also subjected to vertical line block error correction coding processing to improve the correction ability. More specifically, as shown in Table 11, a check bit E1 is added to a horizontal line block, and a check bit E2 is added to a vertical line block.

TABLE 11

|  | Vertical 0 | Vertical 1 | Vertical 2 | Vertical 3 | Vertical 4 | Vertical 5 | Vertical 6 | Horizontal Line Check Bit | | | |
|---|---|---|---|---|---|---|---|---|---|---|---|
| Horizontal 0 | ○ | ○ | ○ | ○ | ○ | ○ | ○ | E1 | E1 | E1 | E1 |
| Horizontal 1 | ○ | ○ | ○ | ○ | ○ | ○ | ○ | E1 | E1 | E1 | E1 |
| Horizontal 2 | ○ | ○ | ○ | ○ | ○ | ○ | ○ | E1 | E1 | E1 | E1 |
| Horizontal 3 | ○ | ○ | ○ | ○ | ○ | ○ | ○ | E1 | E1 | E1 | E1 |
| Horizontal 4 | ○ | ○ | ○ | ○ | ○ | ○ | ○ | E1 | E1 | E1 | E1 |
| Horizontal 5 | ○ | ○ | ○ | ○ | ○ | ○ | ○ | E1 | E1 | E1 | E1 |
| Horizontal 6 | ○ | ○ | ○ | ○ | ○ | ○ | ○ | E1 | E1 | E1 | E1 |
| Vertical Line Check Bit | E2 E2 E2 E2 | E2 E2 E2 E2 | E2 E2 E2 E2 | E2 E2 E2 E2 | E2 E2 E2 E2 | E2 E2 E2 E2 | E2 E2 E2 E2 | E2 E2 E2 E2 | E2 E2 E2 E2 | E2 E2 E2 E2 | E2 E2 E2 E2 |

As shown in Table 12, the check bit E1 of the horizontal line block may be added to the check bit E2 of the vertical line block to perform error correction coding.

TABLE 12

| | Vertical 0 | Vertical 1 | Vertical 2 | Vertical 3 | Vertical 4 | Vertical 5 | Vertical 6 | Horizontal Line Check Bit | | | |
|---|---|---|---|---|---|---|---|---|---|---|---|
| Horizontal 0 | ○ | ○ | ○ | ○ | ○ | ○ | ○ | E1 | E1 | E1 | E1 |
| Horizontal 1 | ○ | ○ | ○ | ○ | ○ | ○ | ○ | E1 | E1 | E1 | E1 |
| Horizontal 2 | ○ | ○ | ○ | ○ | ○ | ○ | ○ | E1 | E1 | E1 | E1 |
| Horizontal 3 | ○ | ○ | ○ | ○ | ○ | ○ | ○ | E1 | E1 | E1 | E1 |
| Horizontal 4 | ○ | ○ | ○ | ○ | ○ | ○ | ○ | E1 | E1 | E1 | E1 |
| Horizontal 5 | ○ | ○ | ○ | ○ | ○ | ○ | ○ | E1 | E1 | E1 | E1 |
| Horizontal 6 | ○ | ○ | ○ | ○ | ○ | ○ | ○ | E1 | E1 | E1 | E1 |
| Vertical Line Check Bit | E2 | E2 | E2 | E2 | E2 | E2 | E2 | E1 | E1 | E1 | E1 |
| | E2 | E2 | E2 | E2 | E2 | E2 | E2 | E1 | E1 | E1 | E1 |
| | E2 | E2 | E2 | E2 | E2 | E2 | E2 | E1 | E1 | E1 | E1 |
| | E2 | E2 | E2 | E2 | E2 | E2 | E2 | E1 | E1 | E1 | E1 |

As described above, in the first and second embodiments, although a simple error correction method (FEC: Forward Error Correction) is used, an error pattern that cannot be error-corrected by the prior art can be corrected. In addition, although the coding rate is equal to that of the prior art (first embodiment) or slightly higher than that of the prior art (second embodiment), the maximum number of correctable bits can be made the same as that of the prior art. As a consequence, the error correction probability can be improved.

Third Embodiment

The third embodiment will be described next. In the third embodiment, error correction as in the first embodiment is expanded to multi-dimension (K-dimension: K is a natural number of 3 or more) to improve the error correction ability.

Figure 5:
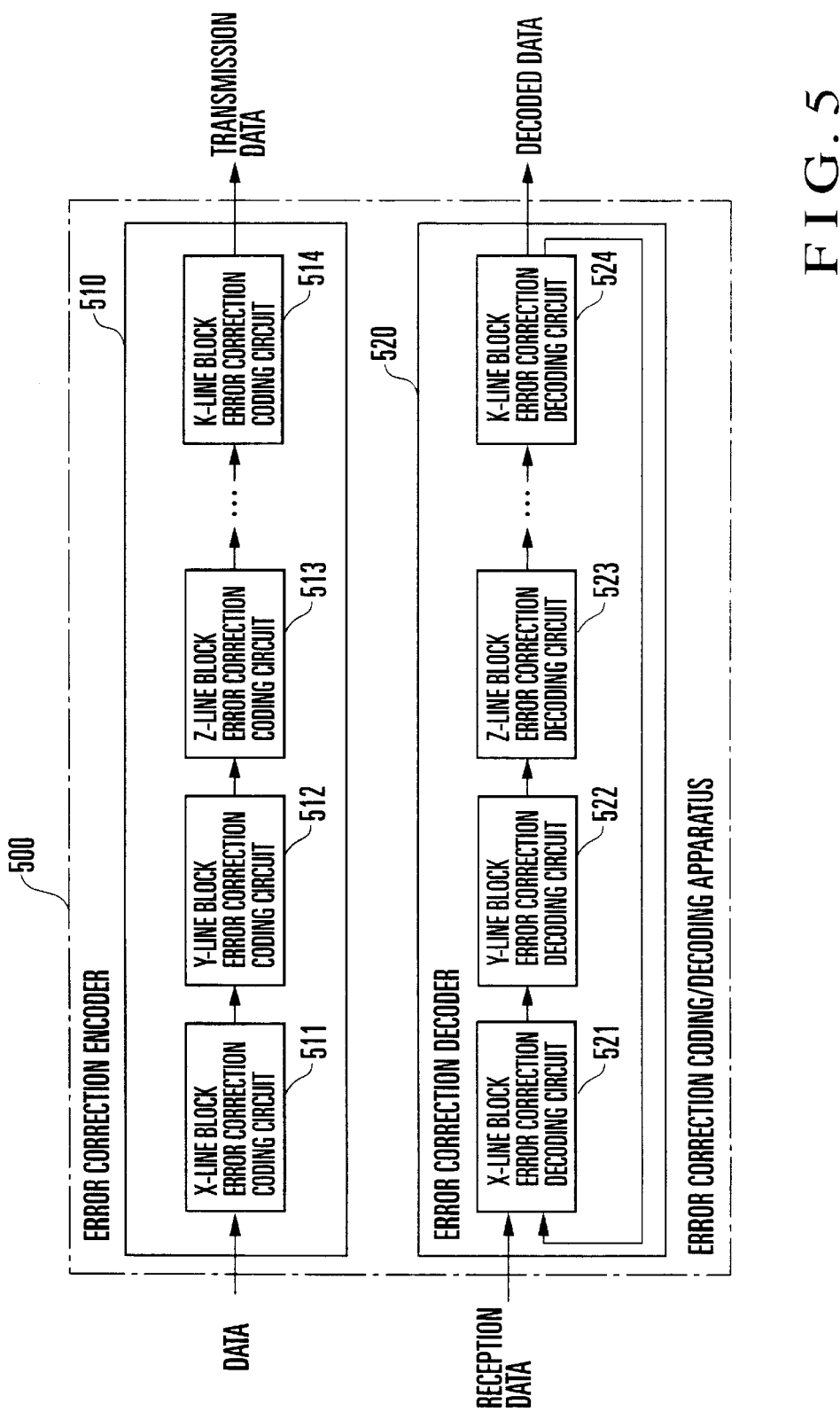
FIG. 5 is a block diagram showing the third embodiment of the present invention.

FIG. 5 shows an error correction coding/decoding apparatus according to the third embodiment. As shown in FIG. 5, an error correction coding/decoding apparatus 500 has an error correction encoder 510 and error correction decoder 520. The error correction encoder 510 has an X-line block error correction coding circuit 511, Y-line block error correction coding circuit 512, Z-line block error correction coding circuit 513, and K-line block error correction coding circuit 514. The error correction decoder 520 has an X-line block error correction decoding circuit 521, Y-line block error correction decoding circuit 522, Z-line block error correction decoding circuit 523, and K-line block error correction decoding circuit 524. For example, in three-dimensional data (K=3) where horizontal line blocks (X-line blocks) and vertical line blocks (Y-line blocks) parallel in the horizontal direction are stacked, data bits are arranged on three-dimensional arrays D (0, 0, 0) to D (m−1, n−1, p−1), and three-dimensional error correction is repeated. When error correction is expanded to K-dimensional data (K>3), data bits are arranged on D (0, 0, . . . , 0) to D (m−1, n−1, . . . , q−1), and K-dimensional error correction is repeated. In this case, m, n, p, and q are natural numbers.

Figure 6:
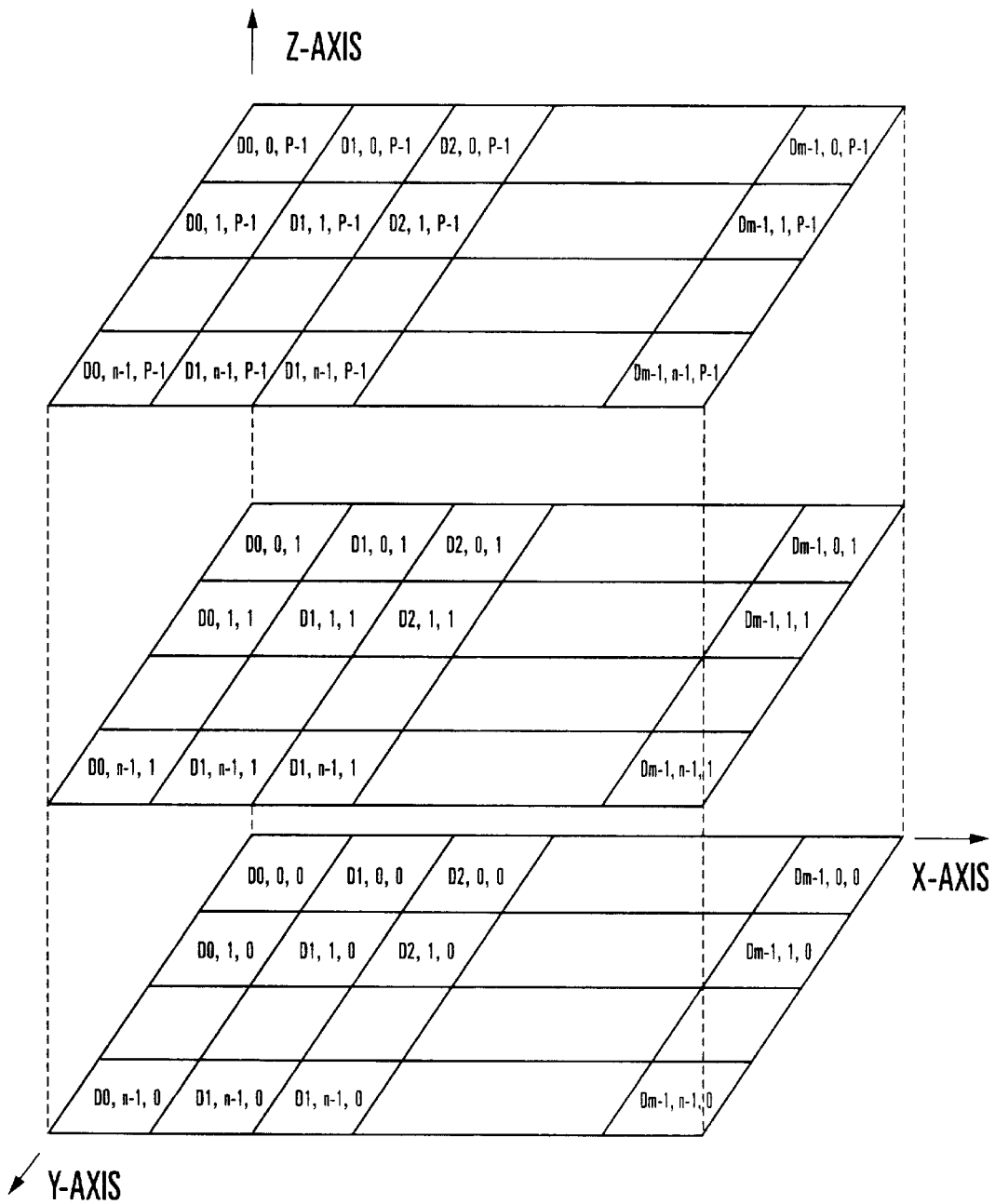
FIG. 6 is a schematic view showing three-dimensional codes.

FIG. 6 shows three-dimensional code (K=3). As shown in FIG. 6, in error correction coding processing, data to be error-corrected are rearranged in a rectangular prism, directions are defined along the X-, Y-, and X-axes, and error correction coding is performed in units of blocks from line X1 to line Xm−1 of the X-line block in the X-axis direction. Next, error correction coding is performed in units of blocks from line Y1 to line Yn−1 of the Y-line block in the Y-axis direction. Furthermore, error correction coding is performed in units of blocks from line Z1 to line Zp−1 of the Z-line block in the Z-axis direction.

In error correction decoding processing, reception data are rearranged in a rectangular prism, as on the transmitting side, and error correction decoding is performed in units of blocks from line X1 to line Xm−1 of the X-line block in the X-axis direction. Next, error correction decoding is performed in units of blocks from line Y1 to line Yn−1 of the Y-line block in the Y-axis direction. Furthermore, error correction decoding is performed in units of blocks from line Z1 to line Zp−1 of the Z-line block in the Z-axis direction. By repeating error correction decoding processing of the X-line block, Y-line block, and Z-line block a plurality of number of times, the error correction ability can be improved.

Figure 7A:
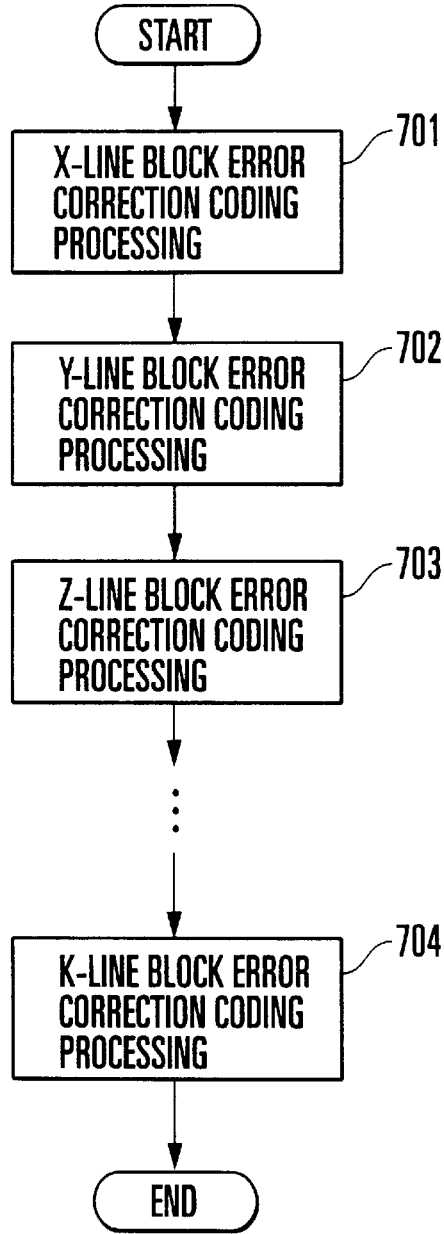
FIG. 7A is a flow chart showing error correction coding processing according to the third embodiment.
Figure 7B:
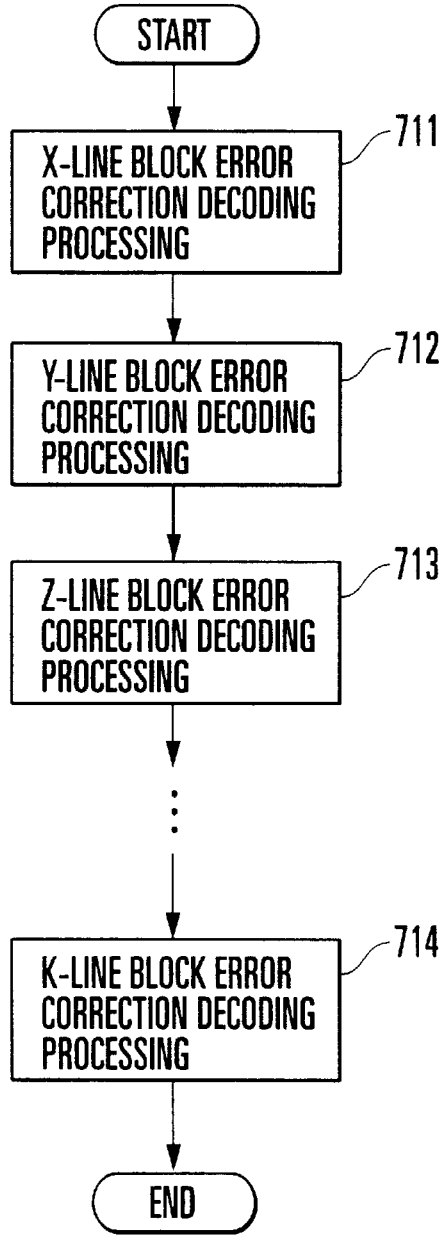
FIG. 7B is a flow chart showing error correction decoding processing according to the third embodiment.

FIGS. 7A and 7B show multi-dimensional coding/decoding processing (K≧3), the number of dimensions is equal to or larger than three. These flow charts correspond to portions A and B in FIGS. 2A and 2B, FIGS. 3A and 3B, and FIGS. 4A and 4B. In a multi-dimensional coding/decoding having the number of dimensions equal to or larger than three, error correction is repeated a number of times corresponding to the number of dimensions (K). This also applies to a code such as a Reed-Solomon code for which symbol error correction is performed.

Fourth Embodiment

FIG. 8 shows the arrangement of an error correction coding/decoding apparatus according to the fourth embodiment. Referring to FIG. 8, an error correction coding/decoding apparatus 800 has an error correction encoder 810 on the transmitting side and an error correction decoder 820 on the receiving side. The error correction encoder 810 on the transmitting side has a horizontal line block error correction coding circuit 812 and vertical line block error correction coding circuit 813. A CRC (Cyclic Redundancy Check) coding circuit 811 is also arranged on the input side of the horizontal line block error correction coding circuit 812. The error correction decoder 820 on the receiving side has a horizontal line block error correction decoding circuit 821 and vertical line block error correction decoding circuit 822. In addition, a CRC error detection circuit 823 is arranged on the output side of the vertical line block error correction decoding circuit 822.

The operation of the fourth embodiment will be described next.

Figure 9B:
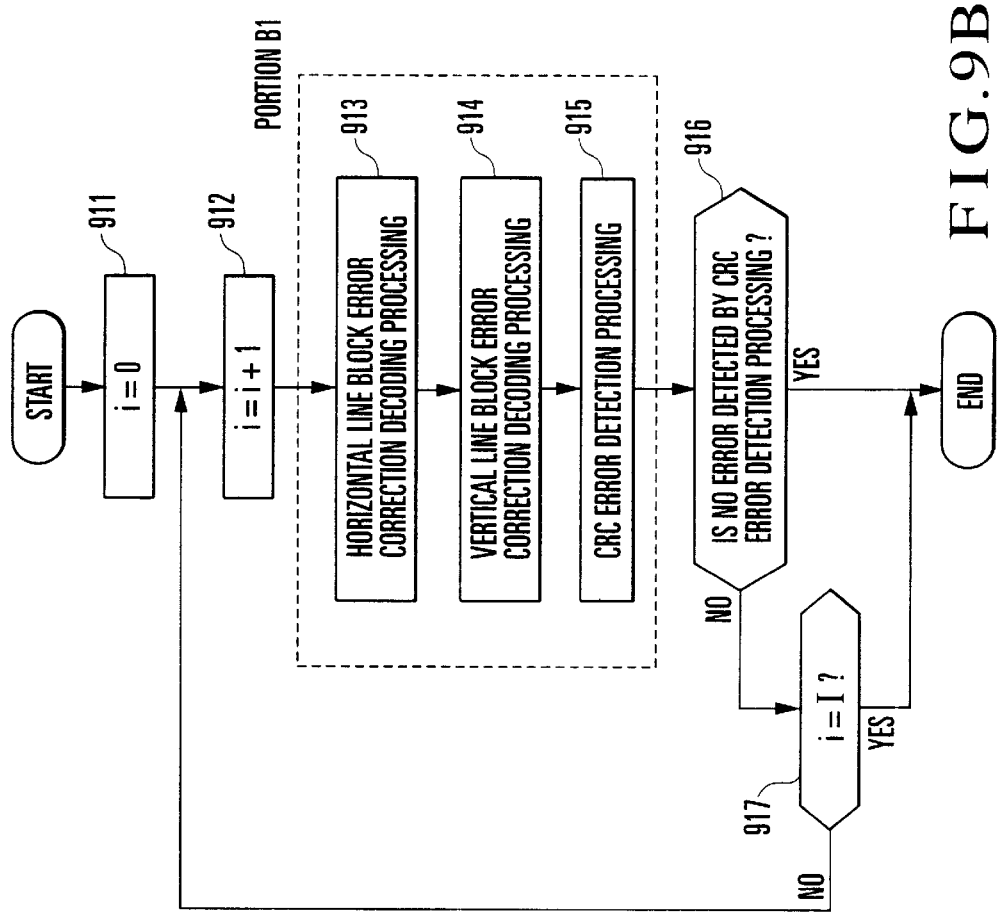
FIG. 9B is a flow chart showing error correction decoding processing according to the fourth embodiment (K=2)
Figure 9A:
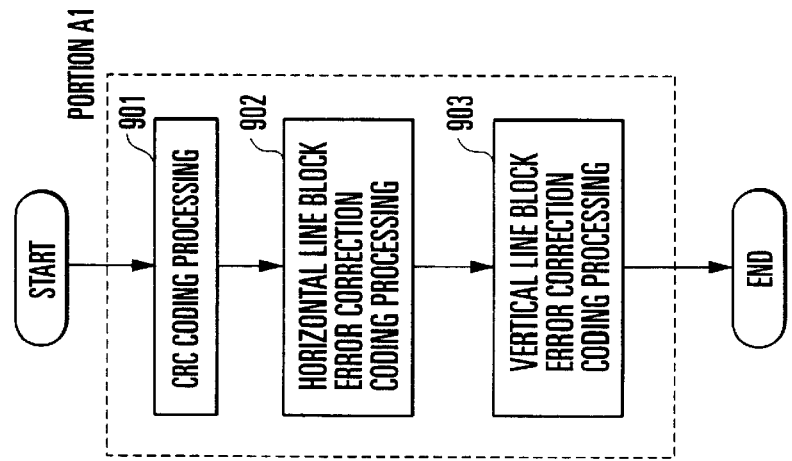
FIG. 9A is a flow chart showing error correction coding processing according to the fourth embodiment (K=2)

FIGS. 9A and 10A show error correction coding processing. FIGS. 9B and 10B show error correction decoding processing. The CRC coding circuit 811 of the error correction encoder 810 on the transmitting side processes data by CRC (Cyclic Redundancy Check) (step 901 or 1001). After that, the horizontal line block error correction coding circuit 812 and vertical line block error correction coding circuit 813 perform error correction processing for the horizontal line blocks and vertical line blocks, as in the first embodiment.

In the error correction decoder 820 on the receiving side, every time the horizontal line block error correction decoding circuit 821 and vertical line block error correction decoding circuit 822 end error correction processing for the horizontal line blocks and vertical line blocks, as in the first embodiment, the CRC error detection circuit 823 detects errors by CRC (step 915 or 1015). When no error is detected anymore, error correction decoding processing is ended (step 916 or 1016). In the prior art, CRC is performed for a plurality of horizontal line blocks or all data. However, in the fourth embodiment, errors are detected by CRC in units of horizontal line blocks or vertical line blocks, so decoding processing in error correction can be performed at a high speed.

Figure 11:
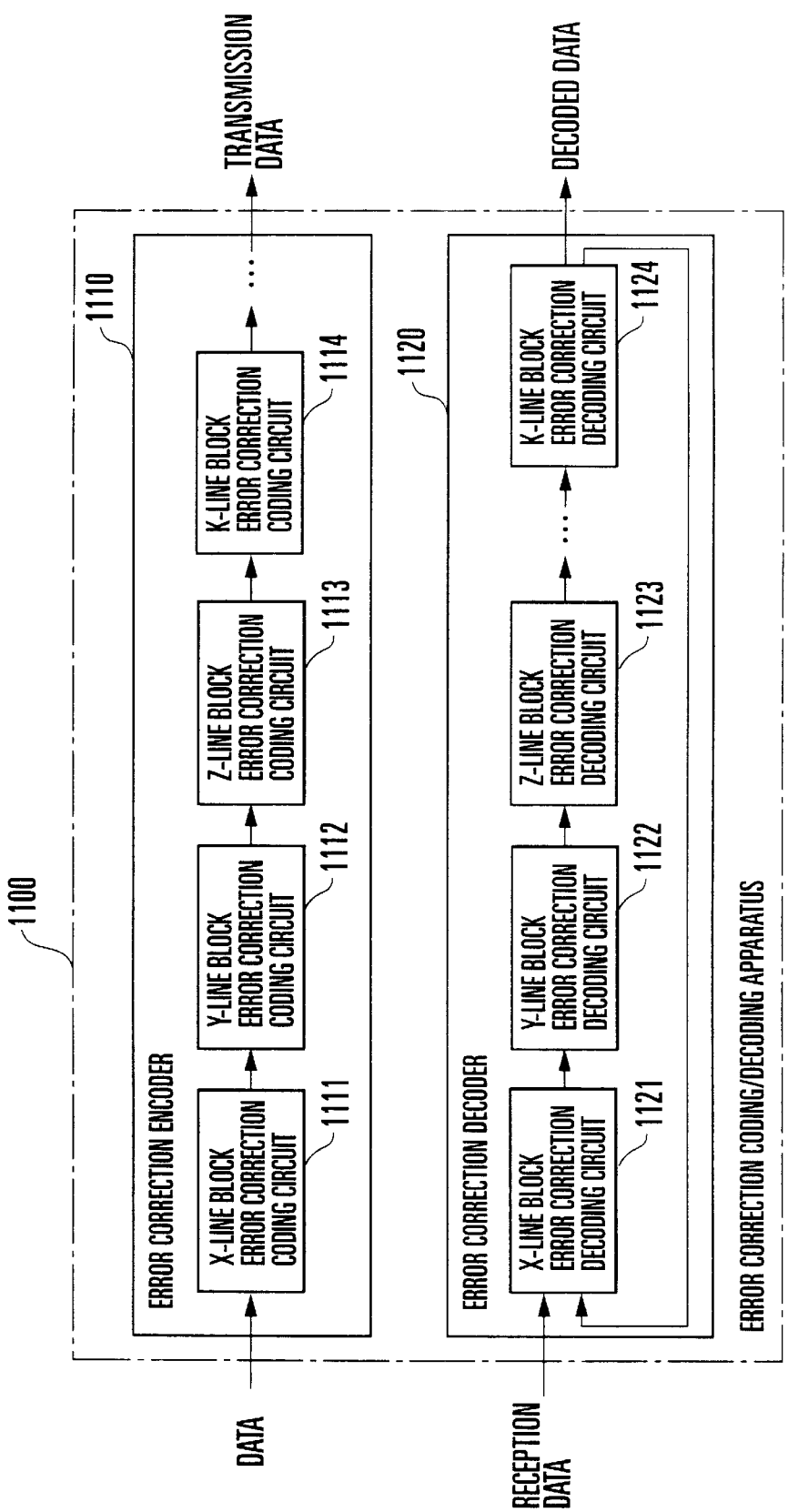
FIG. 11 is a block diagram showing the fourth embodiment (K≧3) of the present invention.
Figure 12A:
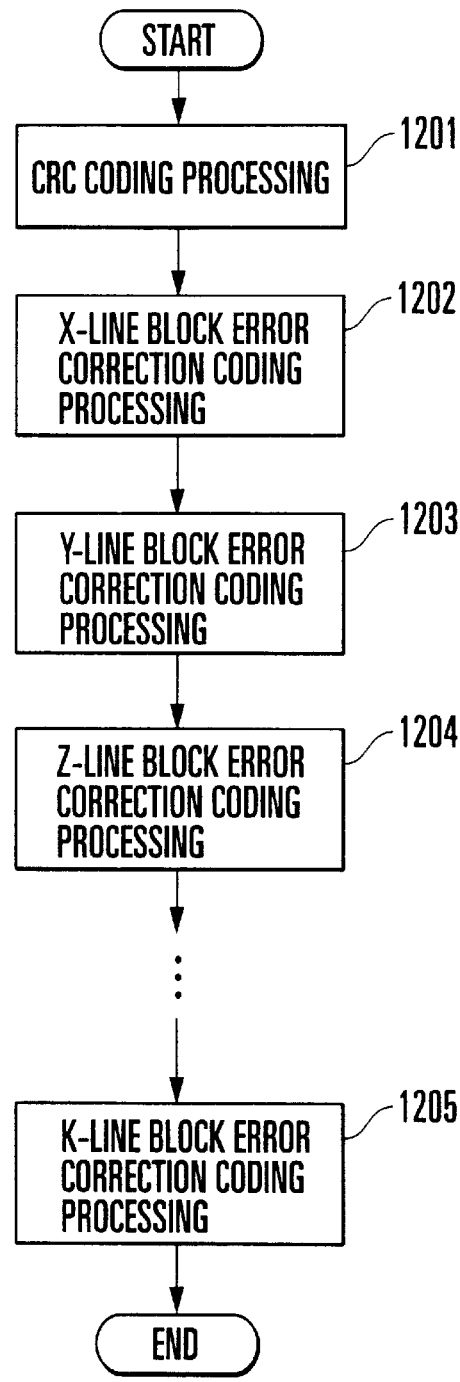
FIG. 12A is a flow chart showing error correction coding processing according to the fourth embodiment (K≧3)
Figure 12B:
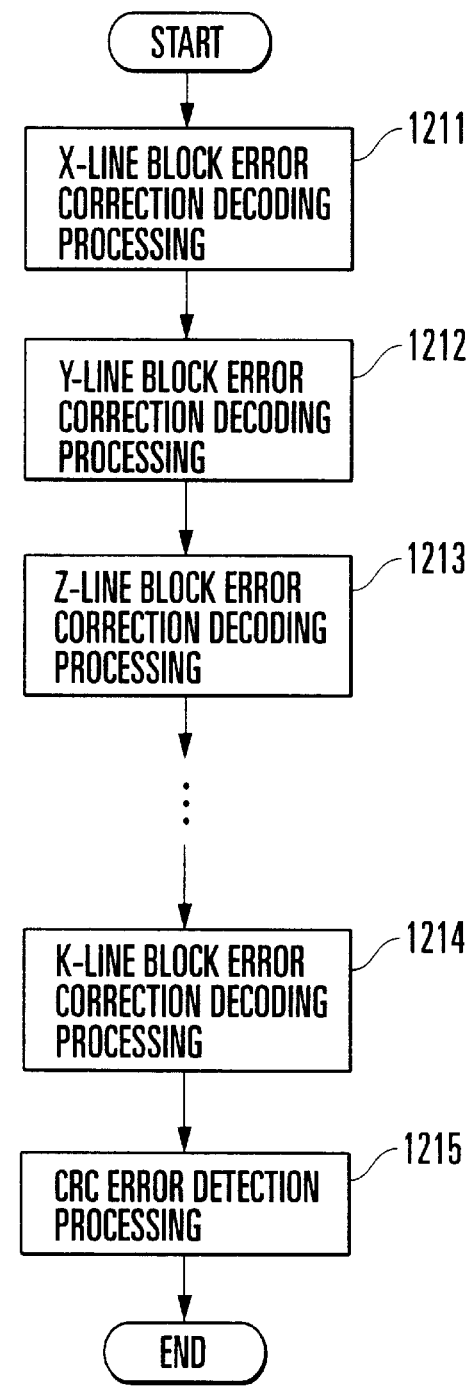
FIG. 12B is a flow chart showing error correction decoding processing according to the fourth embodiment (K≧3)

Expansion to multi-dimensional data in the third embodiment can be directly applied to processing of the fourth embodiment. In this case, the error correction coding/decoding apparatus has an arrangement shown in FIG. 11. An error correction coding/decoding apparatus 1100 comprises an error correction encoder 1110 and error correction decoder 1120. The error correction encoder 1110 has a CRC coding circuit 1111 and a plurality of subsequent error correction coding circuits (X-line block error correction coding circuit 1112, Y-line block error correction coding circuit 1113, Z-line block error correction coding circuit 1114, . . . ) The error correction decoder 1120 has a plurality of error correction decoding circuits (X-line block error correction decoding circuit 1121, Y-line block error correction decoding circuit 1122, Z-line block error correction decoding circuit 1123, . . . ) and a subsequent CRC error detection circuit 1124. FIG. 12A shows procedures corresponding to a portion A1 of error correction coding processing. FIG. 12B shows procedures corresponding to a portion B1 of error correction decoding processing.

A specific operation of the fourth embodiment will be described next. Assume that 16 CRC check bits are added to 33 information bits, and BCH codes capable of 1-bit error correction are used. When the following procedures (4-1) to (4-7) are executed, even errors concentrating to a horizontal line block can be corrected, unlike the prior art.

(4-1) As shown in Table 13, 16 CRC check bits are added to 33 information bits by the CRC coding circuit of the error correction encoder, and the information bits (33 bits) and CRC check bits (16 bits) are combined to 49 bits. In Table 13, D represents an information bit, and C represents a CRC check bit.

TABLE 13

| | |
|---|---|
| Information Bit | DDDDDDDDDDDDDDDDDDDDDDDDDDDDDDDDD |
| CRC Check Bit | CCCCCCCCCCCCCCCC |

(4-2) As shown in Table 14, the information bits and CRC check bits are rearranged to 7×7 parallelly (rectangularly) in the horizontal direction.

TABLE 14

| | Vertical 0 | Vertical 1 | Vertical 2 | Vertical 3 | Vertical 4 | Vertical 5 | Vertical 6 |
|---|---|---|---|---|---|---|---|
| Horizontal 0 | D | D | D | D | D | D | D |
| Horizontal 1 | D | D | D | D | D | D | D |
| Horizontal 2 | D | D | D | D | D | D | D |
| Horizontal 3 | D | D | D | D | D | D | D |
| Horizontal 4 | D | D | D | D | D | C | C |
| Horizontal 5 | C | C | C | C | C | C | C |
| Horizontal 6 | C | C | C | C | C | C | C |

(4-3) Error correction check bits E shown in Table 15 are added to the bits rearranged to 7×7 parallelly (rectangularly) in the horizontal direction.

TABLE 15

| | Vertical 0 | Vertical 1 | Vertical 2 | Vertical 3 | Vertical 4 | Vertical 5 | Vertical 6 | Horizontal Line Check Bit | | | |
|---|---|---|---|---|---|---|---|---|---|---|---|
| Horizontal 0 | D | D | D | D | D | D | D | E | E | E | E |
| Horizontal 1 | D | D | D | D | D | D | D | E | E | E | E |
| Horizontal 2 | D | D | D | D | D | D | D | E | E | E | E |
| Horizontal 3 | D | D | D | D | D | D | D | E | E | E | E |
| Horizontal 4 | D | D | D | D | D | C | C | E | E | E | E |
| Horizontal 5 | C | C | C | C | C | C | C | E | E | E | E |

TABLE 15-continued

| | Vertical 0 | Vertical 1 | Vertical 2 | Vertical 3 | Vertical 4 | Vertical 5 | Vertical 6 | Horizontal Line Check Bit | | | |
|---|---|---|---|---|---|---|---|---|---|---|---|
| Horizontal 6 | C | C | C | C | C | C | C | E | E | E | E |
| Vertical Line Check Bit | E E E E | E E E E | E E E E | E E E E | E E E E | E E E E | E E E E | | | | |

(4-4) Assume that an error occurs during transmission, and reception data shown in Table 16 is obtained. In Table 16, ○ represents a bit without any error, and X represents a bit with an error.

TABLE 16

| | Vertical 0 | Vertical 1 | Vertical 2 | Vertical 3 | Vertical 4 | Vertical 5 | Vertical 6 | Horizontal Line Check Bit | | | |
|---|---|---|---|---|---|---|---|---|---|---|---|
| Horizontal 0 | × | × | × | × | × | × | × | × | ○ | ○ | ○ |
| Horizontal 1 | × | ○ | ○ | ○ | ○ | ○ | ○ | ○ | ○ | ○ | ○ |
| Horizontal 2 | × | ○ | ○ | ○ | ○ | ○ | ○ | ○ | ○ | ○ | ○ |
| Horizontal 3 | × | ○ | ○ | ○ | ○ | ○ | ○ | ○ | ○ | ○ | ○ |
| Horizontal 4 | × | ○ | ○ | ○ | ○ | ○ | ○ | ○ | ○ | ○ | ○ |
| Horizontal 5 | × | ○ | ○ | ○ | ○ | ○ | ○ | ○ | ○ | ○ | ○ |
| Horizontal 6 | × | ○ | ○ | ○ | ○ | ○ | ○ | ○ | ○ | ○ | ○ |
| Vertical Line Check Bit | ○ ○ ○ ○ | ○ ○ ○ ○ | ○ ○ ○ ○ | ○ ○ ○ ○ | ○ ○ ○ ○ | ○ ○ ○ ○ | ○ ○ ○ ○ | | | | |

(4-5) Error correction is performed for horizontal line blocks, as shown in Table 17. Since 1-bit correction is possible, errors in horizontal line blocks 1 to 6 can be corrected. However, errors in horizontal line block 0 cannot be corrected. ⊙ represents an error-corrected bit.

TABLE 17

| | Vertical 0 | Vertical 1 | Vertical 2 | Vertical 3 | Vertical 4 | Vertical 5 | Vertical 6 | Horizontal Line Check Bit | | | |
|---|---|---|---|---|---|---|---|---|---|---|---|
| Horizontal 0 | × | × | × | × | × | × | × | × | ○ | ○ | ○ |
| Horizontal 1 | ⊙ | ○ | ○ | ○ | ○ | ○ | ○ | ○ | ○ | ○ | ○ |
| Horizontal 2 | ⊙ | ○ | ○ | ○ | ○ | ○ | ○ | ○ | ○ | ○ | ○ |
| Horizontal 3 | ⊙ | ○ | ○ | ○ | ○ | ○ | ○ | ○ | ○ | ○ | ○ |
| Horizontal 4 | ⊙ | ○ | ○ | ○ | ○ | ○ | ○ | ○ | ○ | ○ | ○ |
| Horizontal 5 | ⊙ | ○ | ○ | ○ | ○ | ○ | ○ | ○ | ○ | ○ | ○ |
| Horizontal 6 | ⊙ | ○ | ○ | ○ | ○ | ○ | ○ | ○ | ○ | ○ | ○ |
| Vertical | | ○ | ○ | ○ | ○ | ○ | ○ | ○ | | | |

TABLE 17-continued

|  | Vertical 0 | Vertical 1 | Vertical 2 | Vertical 3 | Vertical 4 | Vertical 5 | Vertical 6 | Horizontal Line Check Bit |
|---|---|---|---|---|---|---|---|---|
| tical | ○ | ○ | ○ | ○ | ○ | ○ | ○ |  |
| Line | ○ | ○ | ○ | ○ | ○ | ○ | ○ |  |
| Check | ○ | ○ | ○ | ○ | ○ | ○ | ○ |  |
| Bit |  |  |  |  |  |  |  |  |

(4-6) Next, error correction for the vertical line blocks is performed, as shown in Table 18 (1-bit correction is possible). After error correction for the horizontal line blocks and vertical line blocks is performed, CRC error detection processing is performed. In this case, a 1-bit error remains. However, it is an error of a check bit of the error-correcting code and is not subjected to CRC check. As shown in Table 19, since bits subjected to CRC check have no errors, CRC check is "OK". Since CRC is "OK", error correction processing is ended. This embodiment can also be applied to symbol error correction of, e.g., a Reed-Solomon code.

TABLE 18

|  | Vertical 0 | Vertical 1 | Vertical 2 | Vertical 3 | Vertical 4 | Vertical 5 | Vertical 6 | Horizontal Line Check Bit |  |  |  |
|---|---|---|---|---|---|---|---|---|---|---|---|
| Horizontal 0 | ⊚ | ⊚ | ⊚ | ⊚ | ⊚ | ⊚ | ⊚ | × | ○ | ○ | ○ |
| Horizontal 1 | ⊚ | ○ | ○ | ○ | ○ | ○ | ○ | ○ | ○ | ○ | ○ |
| Horizontal 2 | ⊚ | ○ | ○ | ○ | ○ | ○ | ○ | ○ | ○ | ○ | ○ |
| Horizontal 3 | ⊚ | ○ | ○ | ○ | ○ | ○ | ○ | ○ | ○ | ○ | ○ |
| Horizontal 4 | ⊚ | ○ | ○ | ○ | ○ | ○ | ○ | ○ | ○ | ○ | ○ |
| Horizontal 5 | ⊚ | ○ | ○ | ○ | ○ | ○ | ○ | ○ | ○ | ○ | ○ |
| Horizontal 6 | ⊚ | ○ | ○ | ○ | ○ | ○ | ○ | ○ | ○ | ○ | ○ |
| Vertical | ○ | ○ | ○ | ○ | ○ | ○ | ○ |  |  |  |  |
| Line | ○ | ○ | ○ | ○ | ○ | ○ | ○ |  |  |  |  |
| Check | ○ | ○ | ○ | ○ | ○ | ○ | ○ |  |  |  |  |
| Bit |  |  |  |  |  |  |  |  |  |  |  |

TABLE 19

|  | Vertical 0 | Vertical 1 | Vertical 2 | Vertical 3 | Vertical 4 | Vertical 5 | Vertical 6 |
|---|---|---|---|---|---|---|---|
| Horizontal 0 | ○ | ○ | ○ | ○ | ○ | ○ | ○ |
| Horizontal 1 | ○ | ○ | ○ | ○ | ○ | ○ | ○ |
| Horizontal 2 | ○ | ○ | ○ | ○ | ○ | ○ | ○ |
| Horizontal 3 | ○ | ○ | ○ | ○ | ○ | ○ | ○ |
| Horizontal 4 | ○ | ○ | ○ | ○ | ○ | ○ | ○ |
| Horizontal 5 | ○ | ○ | ○ | ○ | ○ | ○ | ○ |
| Horizontal 6 | ○ | ○ | ○ | ○ | ○ | ○ | ○ |

Fifth Embodiment

Figure 13:
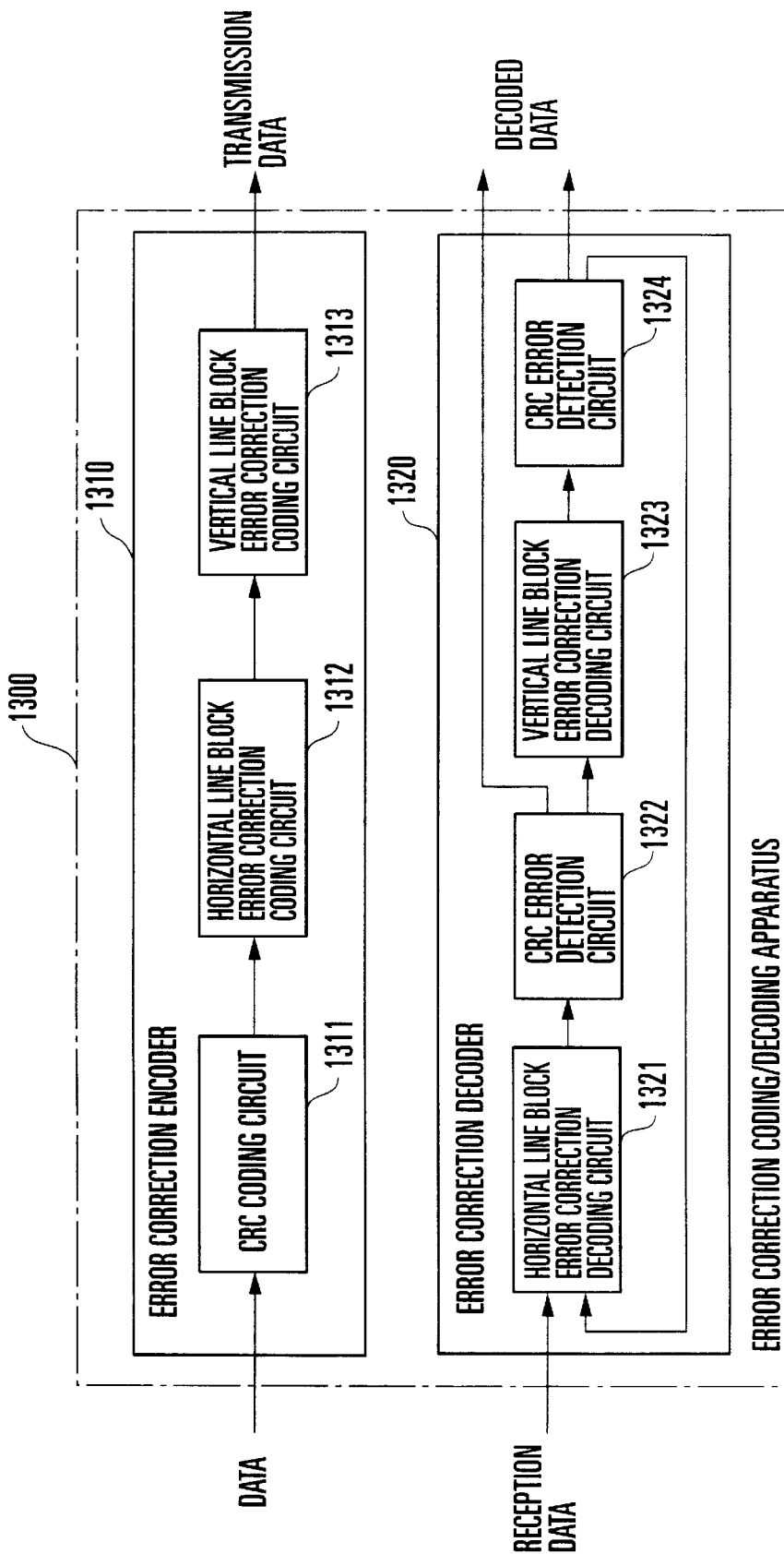
FIG. 13 is a block diagram showing the fifth embodiment (K=2) of the present invention.

FIG. 13 shows the arrangement of an error correction coding/decoding apparatus according to the fifth embodiment. Referring to FIG. 13, an error correction coding/decoding apparatus 1300 has an error correction encoder 1310 on the transmitting side and an error correction decoder 1320 on the receiving side. The error correction encoder 1310 on the transmitting side has a CRC coding circuit 1311, horizontal line block error correction coding circuit 1312, and vertical line block error correction coding circuit 1313, i.e., the same arrangement as in the third embodiment. Hence, the operation of the fifth embodiment is the same as in the third embodiment.

On the other hand, the error correction decoder 1320 on the receiving side has a horizontal line block error correction decoding circuit 1321 and vertical line block error correction decoding circuit 1323, which have the same arrangement and perform the same operation as in the third embodiment. The error correction decoder 1320 also has CRC error detection circuits 1322 and 1324 between the horizontal line block error correction decoding circuit 1321 and the vertical line block error correction decoding circuit 1323. The outputs from the CRC error detection circuits 1322 and 1324 are externally output together with decoded data.

Figure 14B:
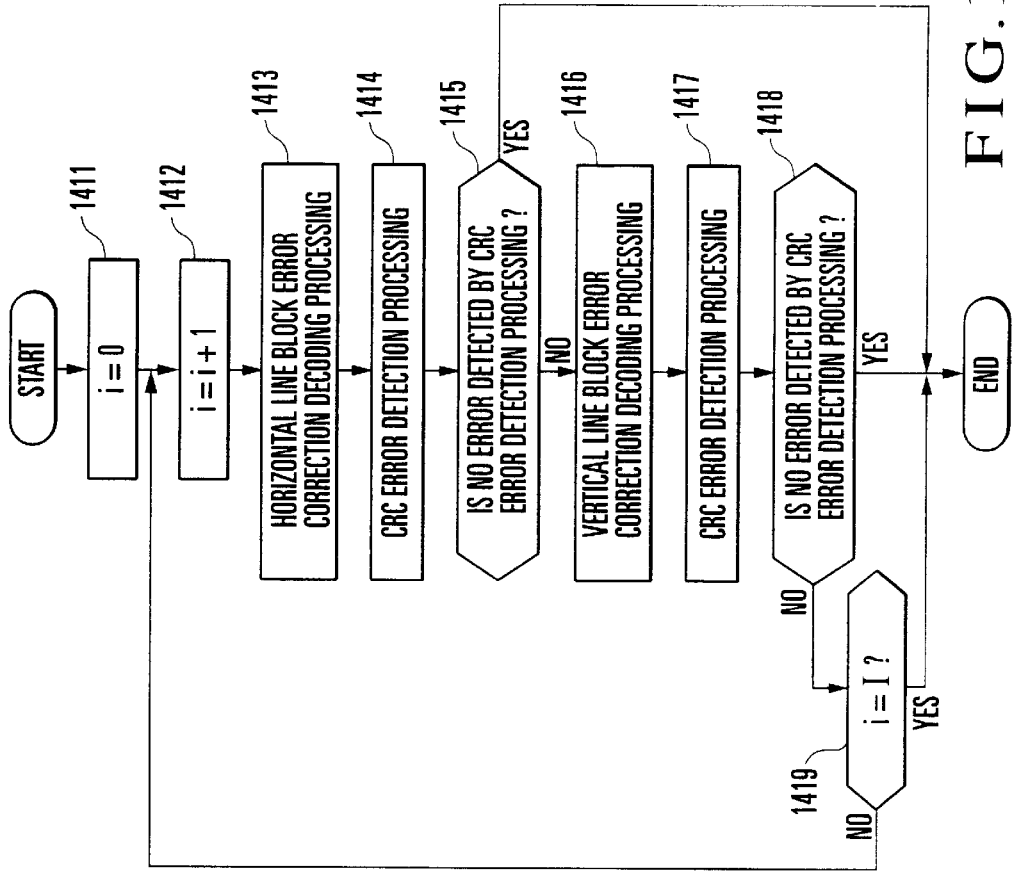
FIG. 14B is a flow chart showing error correction decoding processing according to the fifth embodiment (K=2)
Figure 14A:
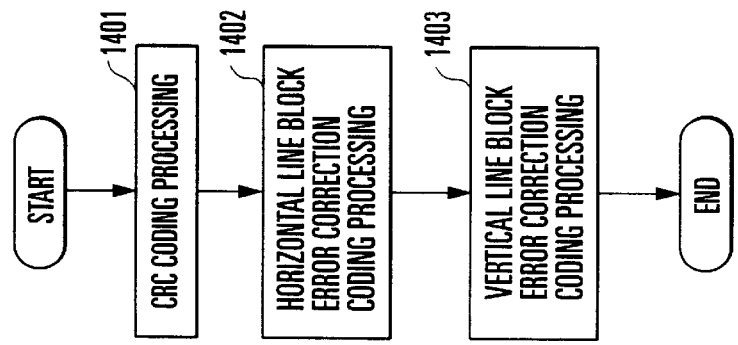
FIG. 14A is a flow chart showing error correction coding processing according to the fifth embodiment (K=2)
Figure 15B:
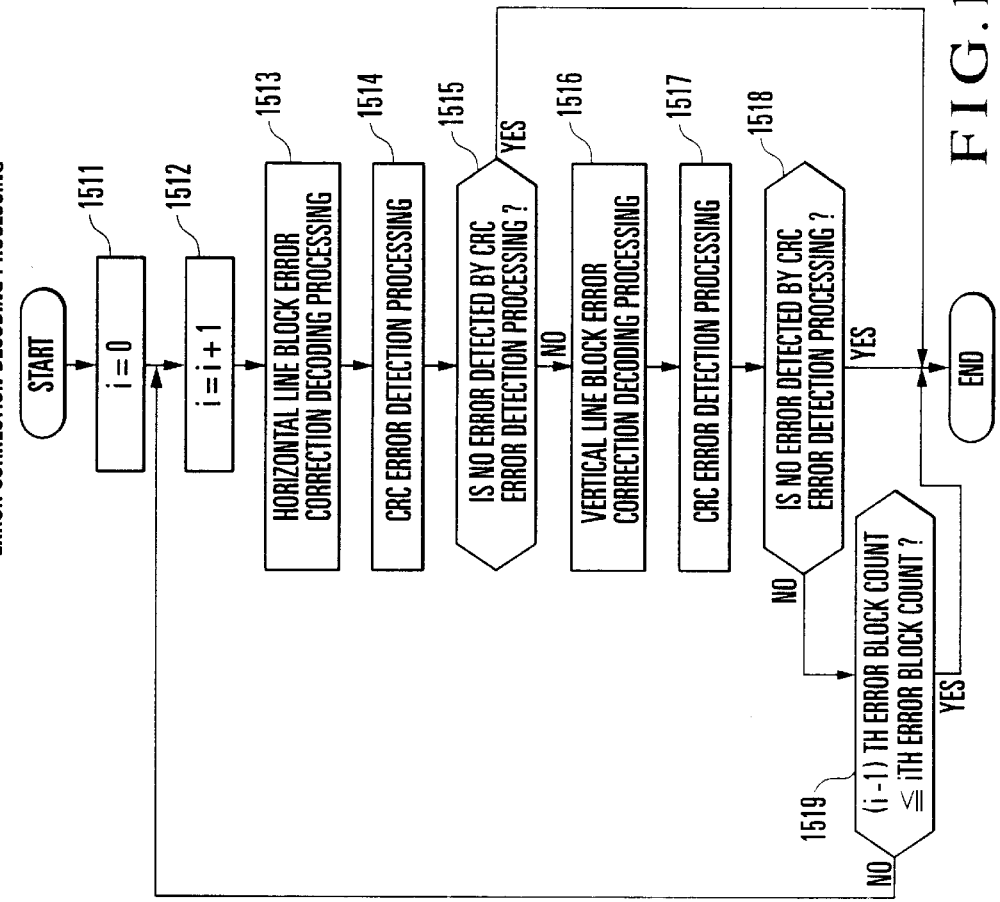
FIG. 15B is a flow chart showing error correction decoding processing according to the fifth embodiment (K=2)
Figure 15A:
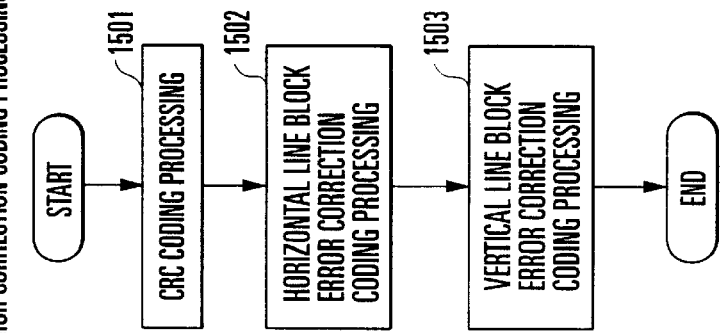
FIG. 15A is a flow chart showing error correction coding processing according to the fifth embodiment (K=2)

FIGS. 14A and 15A show error correction coding processing. FIGS. 14B and 15B show error correction decoding processing. The CRC error detection circuit 1322 on the output side of the horizontal line block error correction decoding circuit 1321 detects errors by CRC every time horizontal line error correction processing by the horizontal line block error correction decoding circuit 1321 is ended (step 1414 or 1514). Next, the CRC error detection circuit 1324 on the output side of the vertical line block error correction decoding circuit 1323 detects errors by CRC every time vertical line error correction processing by the vertical line block error correction decoding circuit 1323 is ended (step 1417 or 1517). After that, when it is determined that the CRC error detection circuits 1322 and 1324 detect no errors, error correction decoding processing is ended (step 1418 or 1518). In this case, error correction decoding processing can be performed at a high speed, as in the fourth embodiment.

Figure 16:
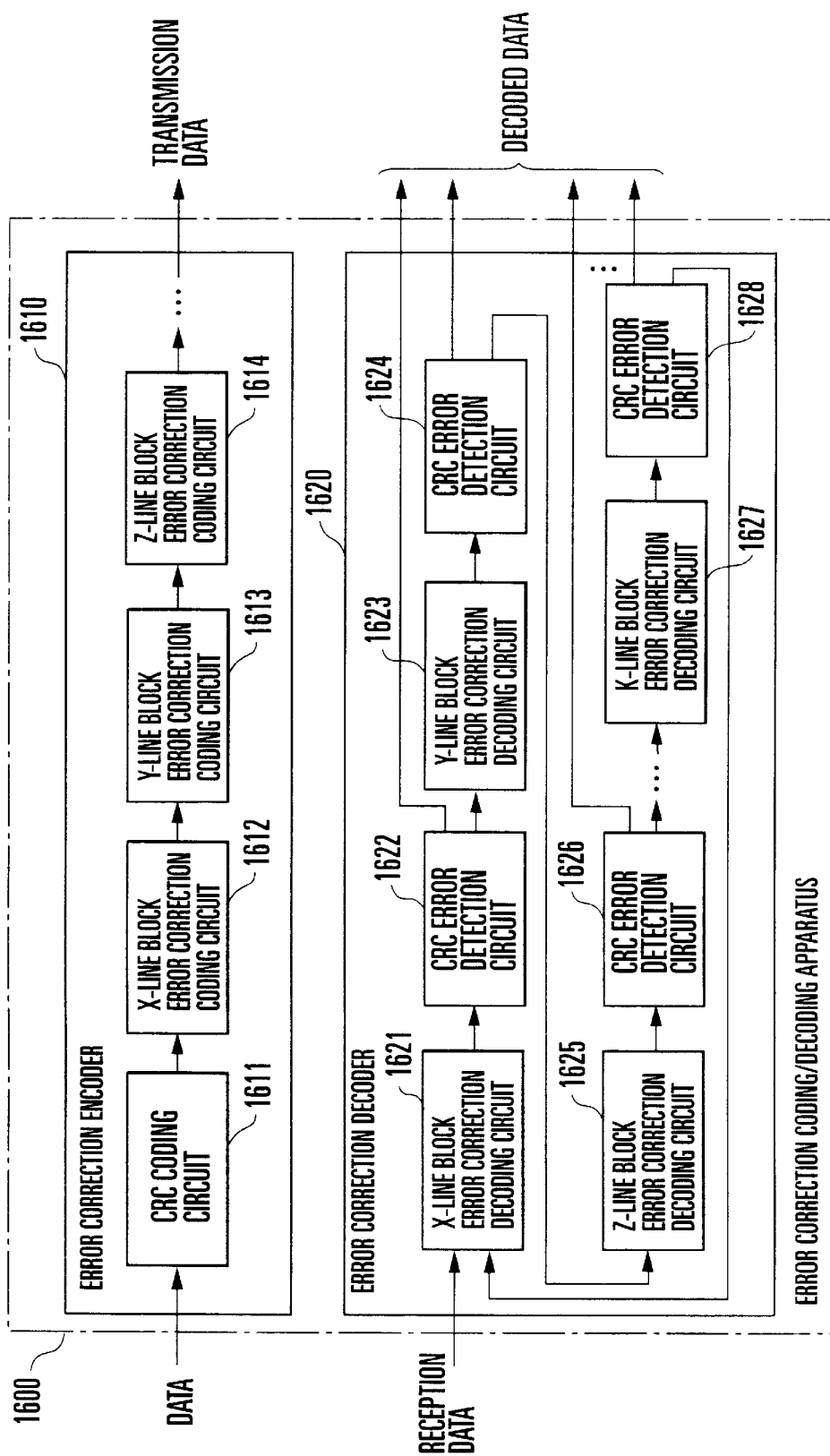
FIG. 16 is a block diagram showing the fifth embodiment (K≧3) of the present invention.

Expansion to multi-dimensional data in the third embodiment can be directly applied to processing of the fifth embodiment. In this case, the error correction coding/decoding apparatus has an arrangement shown in FIG. 16. An error correction coding/decoding apparatus 1600 comprises an error correction encoder 1610 and error correction decoder 1620. The error correction encoder 1610 has a CRC coding circuit 1611 and a plurality of subsequent error correction coding circuits (X-line block error correction coding circuit 1612, Y-line block error correction coding circuit 1613, Z-line block error correction coding circuit 1614, ... ) The error correction decoder 1620 has a plurality of error correction decoding circuits (X-line block error correction decoding circuit 1621, Y-line block error correction decoding circuit 1623, Z-line block error correction decoding circuit 1625, and K-line block error correction decoding circuit 1627) and CRC error detection circuits (CRC error detection circuit 1622, CRC error detection circuit 1624, CRC error detection circuit 1626, and CRC error detection circuit 1628) connected between the error correction decoding circuits. The outputs from the CRC error detection circuits are externally output together with decoded data.

Figure 17B:
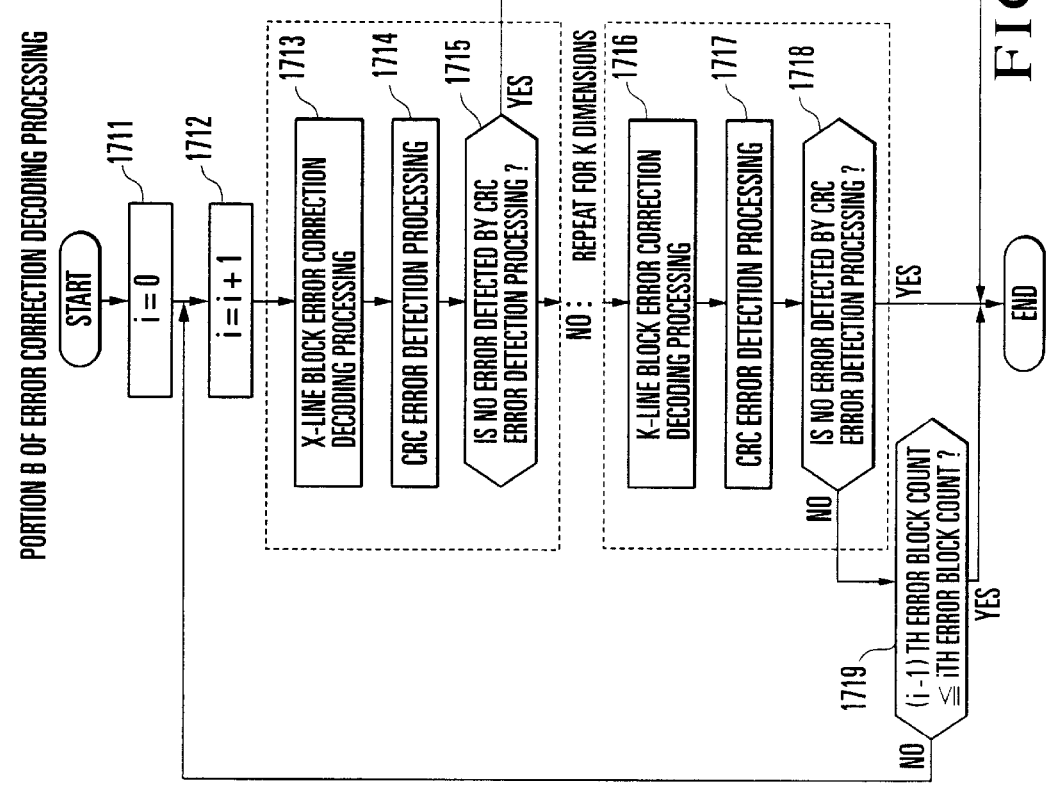
FIG. 17B is a flow chart showing error correction decoding processing according to the fifth embodiment (K≧3)
Figure 17A:
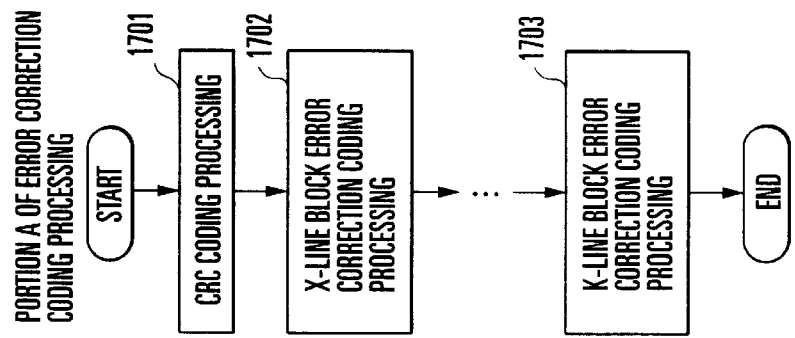
FIG. 17A is a flow chart showing error correction coding processing according to the fifth embodiment (K≧3)

FIG. 17A shows error correction coding processing according to this modification. FIG. 17B shows error correction decoding processing. The operation of the fifth embodiment can also be applied to symbol error correction of, e.g., a Reed-Solomon code.

Sixth Embodiment

The sixth embodiment will be described next. The apparatus of the sixth embodiment has the same arrangement as that of the first embodiment shown in FIG. 1. An error correction encoder 110 on the transmitting side (horizontal line block error correction coding circuit 111 and vertical line block error correction coding circuit 112) and an error correction decoder 120 on the receiving side (horizontal line block error correction decoding circuit 121 and vertical line block error correction decoding circuit 122) perform error correction of the sixth embodiment to be described below.

The operation of the sixth embodiment will be described next. In the operation of the sixth embodiment, in bit error-correcting codes such as Hamming codes or BCH codes, bits at which horizontal line blocks and vertical line blocks cross are inverted when error correction cannot be performed in the above-described embodiments, thereby improving the error correction ability. Expansion to multi-dimensional data in the third embodiment can be directly applied to processing of the sixth embodiment.

FIGS. 18A and 18B show error correction coding/decoding processing.

(6-1) Assume that reception data has errors shown in Table 20. X represents a bit with an error.

TABLE 20

|  | Vertical 0 | Vertical 1 | Vertical 2 | Vertical 3 | Vertical 4 | Vertical 5 | Vertical 6 | Horizontal Line Check Bit | | | |
|---|---|---|---|---|---|---|---|---|---|---|---|
| Horizontal 0 | X | X | X | X | X | X | X | ○ | ○ | ○ | ○ |
| Horizontal 1 | X | X | ○ | ○ | ○ | ○ | ○ | ○ | ○ | ○ | ○ |
| Horizontal 2 | X | ○ | X | ○ | ○ | ○ | ○ | ○ | ○ | ○ | ○ |
| Horizontal 3 | X | ○ | ○ | ○ | ○ | ○ | ○ | ○ | ○ | ○ | ○ |
| Horizontal 4 | X | ○ | ○ | ○ | ○ | ○ | ○ | ○ | ○ | ○ | ○ |
| Horizontal 5 | X | ○ | ○ | ○ | ○ | ○ | ○ | ○ | ○ | ○ | ○ |
| Horizontal 6 | X | ○ | ○ | ○ | ○ | ○ | ○ | ○ | ○ | ○ | ○ |
| Vertical Line Check Bit | ○ ○ ○ ○ | ○ ○ ○ ○ | ○ ○ ○ ○ | ○ ○ ○ ○ | ○ ○ ○ ○ | ○ ○ ○ ○ | ○ ○ ○ ○ | | | | |

(6-2) Error correction processing for horizontal lines (X-lines) is performed (i=1).

(6-3) Error-correctable bits are corrected as shown in Table 21. ⊙ represents an error-corrected bit.

(6-4) CRC error detection processing is performed. In this case, since data subjected to CRC check have errors, CRC check is "NG".

TABLE 21

| | Vertical 0 | Vertical 1 | Vertical 2 | Vertical 3 | Vertical 4 | Vertical 5 | Vertical 6 | Horizontal Line Check Bit | | | |
|---|---|---|---|---|---|---|---|---|---|---|---|
| Horizontal 0 | X | X | X | X | X | X | X | ○ | ○ | ○ | ○ |
| Horizontal 1 | X | X | ○ | ○ | ○ | ○ | ○ | ○ | ○ | ○ | ○ |
| Horizontal 2 | X | ○ | X | ○ | ○ | ○ | ○ | ○ | ○ | ○ | ○ |
| Horizontal 3 | ⊙ | ○ | ○ | ○ | ○ | ○ | ○ | ○ | ○ | ○ | ○ |
| Horizontal 4 | ⊙ | ○ | ○ | ○ | ○ | ○ | ○ | ○ | ○ | ○ | ○ |
| Horizontal 5 | ⊙ | ○ | ○ | ○ | ○ | ○ | ○ | ○ | ○ | ○ | ○ |
| Horizontal 6 | ⊙ | ○ | ○ | ○ | ○ | ○ | ○ | ○ | ○ | ○ | ○ |
| Vertical Line Check Bit | ○○○○ | ○○○○ | ○○○○ | ○○○○ | ○○○○ | ○○○○ | ○○○○ | | | | |

(6-5) Error correction processing for vertical lines (Y-lines) is performed (i=1).

(6-6) Error-correctable bits are corrected as shown in Table 22.

(6-7) CRC error detection processing is performed. In this case, since data subjected to CRC check have errors, CRC check is "NG".

TABLE 22

| | Vertical 0 | Vertical 1 | Vertical 2 | Vertical 3 | Vertical 4 | Vertical 5 | Vertical 6 | Horizontal Line Check Bit | | | |
|---|---|---|---|---|---|---|---|---|---|---|---|
| Horizontal 0 | X | X | X | ⊙ | ⊙ | ⊙ | ⊙ | ○ | ○ | ○ | ○ |
| Horizontal 1 | X | X | ○ | ○ | ○ | ○ | ○ | ○ | ○ | ○ | ○ |
| Horizontal 2 | X | ○ | X | ○ | ○ | ○ | ○ | ○ | ○ | ○ | ○ |
| Horizontal 3 | ⊙ | ○ | ○ | ○ | ○ | ○ | ○ | ○ | ○ | ○ | ○ |
| Horizontal 4 | ⊙ | ○ | ○ | ○ | ○ | ○ | ○ | ○ | ○ | ○ | ○ |
| Horizontal 5 | ⊙ | ○ | ○ | ○ | ○ | ○ | ○ | ○ | ○ | ○ | ○ |
| Horizontal 6 | ⊙ | ○ | ○ | ○ | ○ | ○ | ○ | ○ | ○ | ○ | ○ |
| Vertical Line Check Bit | ○○○○ | ○○○○ | ○○○○ | ○○○○ | ○○○○ | ○○○○ | ○○○○ | | | | |

(6-8) Blocks having errors when i=1 are horizontal line 0, horizontal line 1, horizontal line 2, vertical line 0, vertical line 1, and vertical line 2, i.e., a total of 6 blocks. Since the number of error blocks does not decrease even when i=2, cross bit inverting processing for error blocks is performed. When cross bit inverting processing for error blocks is performed, the result as shown in Table 23 is obtained.

TABLE 23

| | Vertical 0 | Vertical 1 | Vertical 2 | Vertical 3 | Vertical 4 | Vertical 5 | Vertical 6 | Horizontal Line Check Bit | | | |
|---|---|---|---|---|---|---|---|---|---|---|---|
| Horizontal 0 | ⊙ | ⊙ | ⊙ | ⊙ | ⊙ | ⊙ | ⊙ | ○ | ○ | ○ | ○ |
| Horizontal 1 | ⊙ | ⊙ | ○ | ○ | ○ | ○ | ○ | ○ | ○ | ○ | ○ |
| Horizontal 2 | ⊙ | ○ | ⊙ | ○ | ○ | ○ | ○ | ○ | ○ | ○ | ○ |
| Horizontal 3 | ⊙ | ○ | ○ | ○ | ○ | ○ | ○ | ○ | ○ | ○ | ○ |
| Horizontal 4 | ⊙ | ○ | ○ | ○ | ○ | ○ | ○ | ○ | ○ | ○ | ○ |
| Horizontal 5 | ⊙ | ○ | ○ | ○ | ○ | ○ | ○ | ○ | ○ | ○ | ○ |
| Horizontal 6 | ⊙ | ○ | ○ | ○ | ○ | ○ | ○ | ○ | ○ | ○ | ○ |
| Vertical Line Check Bit | ○ | ○ | ○ | ○ | ○ | ○ | ○ | | | | |
| | ○ | ○ | ○ | ○ | ○ | ○ | ○ | | | | |
| | ○ | ○ | ○ | ○ | ○ | ○ | ○ | | | | |
| | ○ | ○ | ○ | ○ | ○ | ○ | ○ | | | | |

(6-9) When i=3, error correction processing for horizontal line blocks is performed. Consequently, since CRC error detection processing becomes "OK", the series of processing operations is ended.

Seventh Embodiment

The seventh embodiment will be described next.

The apparatus of the seventh embodiment has the same arrangement as that of the first embodiment shown in FIG. 1. An error correction encoder 110 on the transmitting side (horizontal line block error correction coding circuit 111 and vertical line block error correction coding circuit 112) and an error correction decoder 120 on the receiving side (horizontal line block error correction decoding circuit 121 and vertical line block error correction decoding circuit 122) perform error correction of the seventh embodiment to be described below.

In the operation of the seventh embodiment, in a symbol error-correcting code such as a Reed-Solomon code, symbols at which horizontal line blocks and vertical line blocks cross are processed as error symbol position information when error correction cannot be performed in the above-described embodiments, thereby improving the error correction ability.

A Reed-Solomon code enables error correction and loss correction by adding a check symbol to an information symbol. Error correction is processing of reconstructing a correct signal transmitted by the transmitting side when symbols having errors in a received signal are unknown. Loss correction is processing of reconstructing a correct signal transmitted by the transmitting side when symbols having errors in a received signal are known. As is generally known, with the error correction ability, when 2N (N: arbitrary natural number) check symbols are present, N error symbols can be corrected. This error correction can be performed when error symbol position information (information representing a symbol having an error in a received signal) is not present. With the loss correction ability, when 2N check symbols are present, 2N lost symbols can be corrected. This correction can be performed when error symbol position information is present. That is, when error symbol position information is present, symbols twice those in the absent of error symbol position information can be corrected.

Figures 19A, 19B:
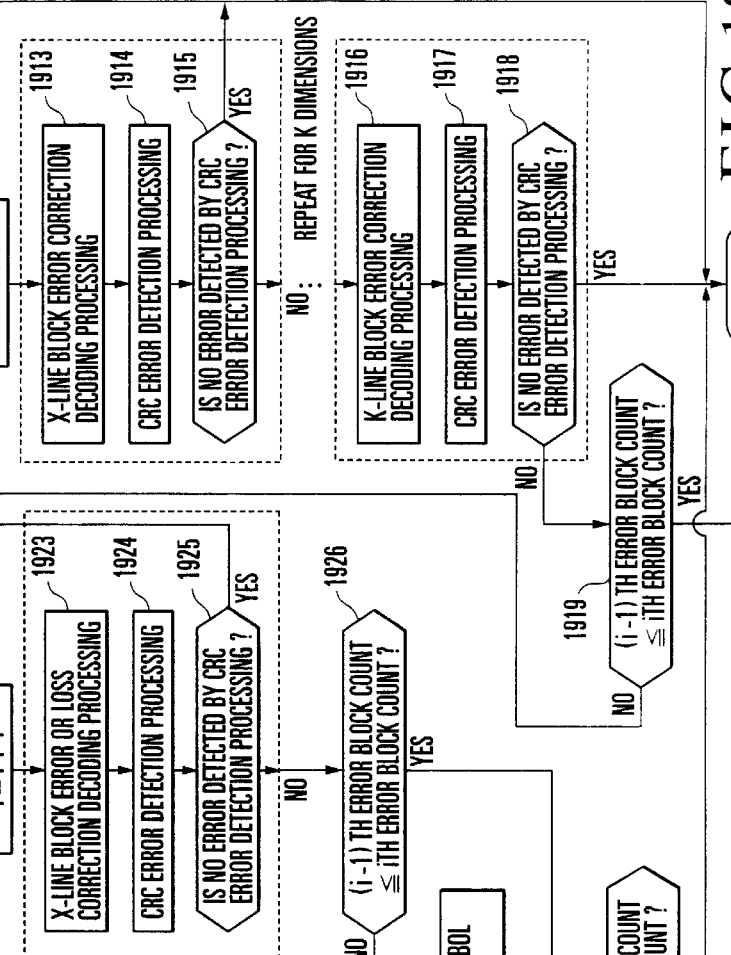
FIG. 19A is a flow chart showing error correction coding processing according to the seventh embodiment.
FIG. 19B is a flow chart showing error correction decoding processing according to the seventh embodiment.

FIG. 19A shows error correction coding processing. FIG. 19B shows error correction decoding processing. An operation in use of a Reed-Solomon code in which one symbol capable of 1-symbol error correction or 2-symbol loss correction has 3 bits, the block length is 21 bits (7 symbols), information bits have 15 bits (5 symbols), and check bits have 6 bits (2 symbols) will be described with reference to these flow charts. Expansion to multi-dimensional data in the third embodiment can be directly applied to processing of the seventh embodiment.

(7-1) Assume that a reception signal has errors shown in Table 24. X represents a bit with an error.

TABLE 24

|  | Vertical 0 | Vertical 1 | Vertical 2 | Vertical 3 | Vertical 4 | Horizontal Line Check Bit | |
|---|---|---|---|---|---|---|---|
| Horizontal 0 | X | X | X | X | X | ○ | ○ |
| Horizontal 1 | X | X | ○ | ○ | ○ | ○ | ○ |
| Horizontal 2 | X | ○ | X | ○ | ○ | ○ | ○ |
| Horizontal 3 | X | ○ | ○ | ○ | ○ | ○ | ○ |
| Horizontal 4 | X | ○ | ○ | ○ | ○ | ○ | ○ |
| Vertical Line Check Bit | ○ ○ | ○ ○ | ○ ○ | ○ ○ | ○ ○ | | |

(7-2) Error correction processing for horizontal lines (X-lines) is performed (i=1).

(7-3) Error-correctable symbols are corrected as shown in Table 25. ⊙ represents an error-corrected symbol.

(7-4) CRC error detection processing is performed. In this case, since data subjected to CRC check have errors, CRC check is "NG".

TABLE 25

|  | Vertical 0 | Vertical 1 | Vertical 2 | Vertical 3 | Vertical 4 | Horizontal Line Check Bit | |
|---|---|---|---|---|---|---|---|
| Horizontal 0 | X | X | X | X | X | ○ | ○ |
| Horizontal 1 | X | X | ○ | ○ | ○ | ○ | ○ |
| Horizontal 2 | X | ○ | X | ○ | ○ | ○ | ○ |
| Horizontal 3 | ⊙ | ○ | ○ | ○ | ○ | ○ | ○ |
| Horizontal 4 | ⊙ | ○ | ○ | ○ | ○ | ○ | ○ |
| Vertical Line Check Bit | ○ ○ | ○ ○ | ○ ○ | ○ ○ | ○ ○ | | |

(7-5) Error correction processing for vertical lines (Y-lines) is performed (i=1).

(7-6) Error-correctable symbols are corrected as shown in Table 26.

(7-7) CRC error detection processing is performed. In this case, since data subjected to CRC check have errors, CRC check is "NG".

TABLE 26

|  | Vertical 0 | Vertical 1 | Vertical 2 | Vertical 3 | Vertical 4 | Horizontal Line Check Bit | |
|---|---|---|---|---|---|---|---|
| Horizontal 0 | X | X | X | ⊙ | ⊙ | ○ | ○ |
| Horizontal 1 | X | X | ○ | ○ | ○ | ○ | ○ |
| Horizontal 2 | X | ○ | X | ○ | ○ | ○ | ○ |
| Horizontal 3 | ⊙ | ○ | ○ | ○ | ○ | ○ | ○ |
| Horizontal 4 | ⊙ | ○ | ○ | ○ | ○ | ○ | ○ |
| Vertical Line Check Bit | ○ ○ | ○ ○ | ○ ○ | ○ ○ | ○ ○ | | |

(7-8) Error blocks when i=1 are horizontal line 0, horizontal line 1, horizontal line 2, vertical line 0, vertical line 1, and vertical line 2, i.e., a total of 6 blocks. Since the number of error blocks does not decrease even when i=2, cross symbol detection inverting processing for error blocks is performed.

(7-9) When i=2, error correction processing for horizontal lines is performed. There are two error blocks. By performing loss correction for blocks of horizontal line 1 and horizontal line 2 which are determined to be capable of loss correction, data as shown in Table 27 are obtained.

TABLE 27

|  | Vertical 0 | Vertical 1 | Vertical 2 | Vertical 3 | Vertical 4 | Horizontal Line Check Bit | |
|---|---|---|---|---|---|---|---|
| Horizontal 0 | X | X | X | ⊙ | ⊙ | ○ | ○ |
| Horizontal 1 | ⊙ | ⊙ | ○ | ○ | ○ | ○ | ○ |
| Horizontal 2 | ⊙ | ○ | ⊙ | ○ | ○ | ○ | ○ |
| Horizontal 3 | ⊙ | ○ | ○ | ○ | ○ | ○ | ○ |
| Horizontal 4 | ⊙ | ○ | ○ | ○ | ○ | ○ | ○ |
| Vertical Line Check Bit | ○ ○ | ○ ○ | ○ ○ | ○ ○ | ○ ○ | | |

(7-10) When i=2, error correction processing for vertical lines is performed. The blocks of horizontal line 1 and horizontal line 2 are loss-recovered by error correction and loss correction for horizontal lines. Error correction for blocks of vertical lines 0 to 4 is performed. The error symbols are corrected as shown in Table 28.

TABLE 28

| | Vertical 0 | Vertical 1 | Vertical 2 | Vertical 3 | Vertical 4 | Horizontal Line Check Bit |
|---|---|---|---|---|---|---|
| Horizontal 0 | ⊚ | ⊚ | ⊚ | ⊚ | ⊚ | ○ ○ |
| Horizontal 1 | ⊚ | ⊚ | ○ | ○ | ○ | ○ ○ |
| Horizontal 2 | ⊚ | ○ | ⊚ | ○ | ○ | ○ ○ |
| Horizontal 3 | ⊚ | ○ | ○ | ○ | ○ | ○ ○ |
| Horizontal 4 | ⊚ | ○ | ○ | ○ | ○ | ○ ○ |
| Vertical Line Check Bit | ○ ○ | ○ ○ | ○ ○ | ○ ○ | ○ ○ | |

(7-11) CRC error detection processing is performed. CRC check is "OK", and error correction decoding processing is ended. When i=2, error correction for vertical lines is performed. The blocks of horizontal line 1 and horizontal line 2 are loss-recovered by error correction and loss correction for horizontal lines. Error correction for blocks of vertical lines 0 to 4 is performed. The error symbols are corrected as shown in Table 28.

As described above, in the sixth and seventh embodiments, error correction can be performed while estimating error bits or error symbols from a plurality of error blocks.

Eighth Embodiment

A concrete example of error correction of a Hamming code using the method described in the first embodiment will be described next.

1. A method of obtaining parity bits from information bits will be described first. A Hamming code having four information bits and three parity check bits will be described. A check code generation matrix P and information bit X are defined as follows.

$$P = \begin{pmatrix} 1 & 1 & 0 \\ 1 & 0 & 1 \\ 0 & 1 & 1 \\ 1 & 1 & 1 \end{pmatrix} : \text{check code generation matrix}$$

$$x = (x_1 \quad x_1 \quad x_3 \quad x_4): \text{information bit}$$

An error correction coding output bit y is represented as follows. Table 29 shows information bits and parity check bits.

$$y = (y_1 \quad y_2 \quad y_3 \quad y_4 \quad y_5 \quad y_6 \quad y_7): \text{error correction coding output bit}$$

$$(y_1 \quad y_2 \quad y_3) = -xP: \text{parity check bit}$$

$$(y_4 \quad y_5 \quad y_6 \quad y_7) = (x_1 \quad x_2 \quad x_3 \quad x_4): \text{information bit}$$

TABLE 29

| Information Bit | Parity Check Bit | Information Bit | Parity Check Bit |
|---|---|---|---|
| (0,0,0,0) | (0,0,0) | (1,0,0,0) | (1,1,0) |
| (0,0,0,1) | (1,1,1) | (1,0,0,1) | (0,0,1) |
| (0,0,1,0) | (0,1,1) | (1,0,1,0) | (1,0,1) |
| (0,0,1,1) | (1,0,0) | (1,0,1,1) | (0,1,0) |
| (0,1,0,0) | (1,0,1) | (1,1,0,0) | (0,1,1) |
| (0,1,0,1) | (0,1,0) | (1,1,0,1) | (1,0,0) |
| (0,1,1,0) | (1,1,0) | (1,1,1,0) | (0,0,0) |
| (0,1,1,1) | (0,0,1) | (1,1,1,1) | (1,1,1) |

2. Error correction in communication using Hamming codes will be described next. A Hamming code having four information bits and three parity check bits will be described. Since the minimum distance of a Hamming code is "3", one error can be corrected. When a syndrome $S=eH^T$ is calculated for an error vector e representing one error, the result shown in Table 30 is obtained. Note that T means transposition of the matrix.

$$H^T = \begin{pmatrix} 1 & 0 & 0 \\ 0 & 1 & 0 \\ 0 & 0 & 1 \\ 1 & 1 & 0 \\ 1 & 0 & 1 \\ 0 & 1 & 1 \\ 1 & 1 & 1 \end{pmatrix} : \text{parity check matrix}$$

TABLE 30

| e | $eH^T$ |
|---|---|
| (1,0,0,0,0,0,0) | (1,0,0) |
| (0,1,0,0,0,0,0) | (0,1,0) |
| (0,0,1,0,0,0,0) | (0,0,1) |
| (0,0,0,1,0,0,0) | (1,1,0) |
| (0,0,0,0,1,0,0) | (1,0,1) |
| (0,0,0,0,0,1,0) | (0,1,1) |
| (0,0,0,0,0,0,1) | (1,1,1) |

The syndrome of a reception language x' matches one of $eH^T$ in Table 30. An error vector corresponding to the syndrome is picked up from the left side of Table 30, and error correction can be performed using x'−ed as a transmission language.

3. A case wherein information bits have 16 bits (0,0,0,0, 0,0,0,0,0,0,0,0,0,0,0,0) will be described next.

(1) The information bits are divided sequentially from the end in units of 4 bits and arranged in a matrix of 4×4, as shown in Table 31.

TABLE 31

| | Vertical 0 | Vertical 1 | Vertical 2 | Vertical 3 |
|---|---|---|---|---|
| Horizontal 0 | 0 | 0 | 0 | 0 |
| Horizontal 1 | 0 | 0 | 0 | 0 |
| Horizontal 2 | 0 | 0 | 0 | 0 |
| Horizontal 3 | 0 | 0 | 0 | 0 |

(2) On the basis of Table 29, check bits are added to information bits in Table 31 (Table 32).

TABLE 32

|  | Information Bit | Check Bit |
|---|---|---|
| Horizontal 0 | (0,0,0,0) | + (0,0,0) |
| Horizontal 1 | (0,0,0,0) | + (0,0,0) |
| Horizontal 2 | (0,0,0,0) | + (0,0,0) |
| Horizontal 3 | (0,0,0,0) | + (0,0,0) |
| Vertical 0 | (0,0,0,0) | + (0,0,0) |
| Vertical 1 | (0,0,0,0) | + (0,0,0) |
| Vertical 2 | (0,0,0,0) | + (0,0,0) |
| Vertical 3 | (0,0,0,0) | + (0,0,0) |

(3) The result shown in Table 32 can be represented as a matrix shown in Table 33.

TABLE 33

|  | Vertical 0 | Vertical 1 | Vertical 2 | Vertical 3 |  |  |  |
|---|---|---|---|---|---|---|---|
| Horizontal 0 | 0 | 0 | 0 | 0 | 0 | 0 | 0 |
| Horizontal 1 | 0 | 0 | 0 | 0 | 0 | 0 | 0 |
| Horizontal 2 | 0 | 0 | 0 | 0 | 0 | 0 | 0 |
| Horizontal 3 | 0 | 0 | 0 | 0 | 0 | 0 | 0 |
|  | 0 | 0 | 0 | 0 |  |  |  |
|  | 0 | 0 | 0 | 0 |  |  |  |
|  | 0 | 0 | 0 | 0 |  |  |  |

(4) Data shown in Table 33 is transmitted from the transmitting side. Assume that the receiving side receives data including errors as shown in Table 34. In this case, error bits are inverted to "1".

TABLE 34

|  | Vertical 0 | Vertical 1 | Vertical 2 | Vertical 3 |  |  |  |
|---|---|---|---|---|---|---|---|
| Horizontal 0 | 1 | 1 | 1 | 1 | 1 | 0 | 0 |
| Horizontal 1 | 1 | 0 | 0 | 0 | 0 | 0 | 0 |
| Horizontal 2 | 1 | 0 | 0 | 0 | 0 | 0 | 0 |
| Horizontal 3 | 1 | 0 | 0 | 0 | 0 | 0 | 0 |
|  | 0 | 0 | 0 | 0 |  |  |  |
|  | 0 | 0 | 0 | 0 |  |  |  |
|  | 0 | 0 | 0 | 0 |  |  |  |

(5) Error correction decoding processing is started. First, error correction in the horizontal direction is performed. The result shown in Table 35 is obtained.

Horizontal 0 X'=(1,1,1,1,1,0,0)
    Syndrome: $S=X'H^T=(1,0,0)$
    Error vector: (1,0,0,0,0,0,0)
    After correction: (0,1,1,1,1,0,0)

Horizontal 1 X'=(1,0,0,0,0,0,0)
    Syndrome: $S=X'H^T=(1,0,0)$
    Error vector: (1,0,0,0,0,0,0)
    After correction: (0,0,0,0,0,0,0)

Horizontal 2 X'=(1,0,0,0,0,0,0)
    Syndrome: $S=X'H^T=(1,0,0)$
    Error vector: (1,0,0,0,0,0,0)
    After correction: (0,0,0,0,0,0,0)

Horizontal 3 X'=(1,0,0,0,0,0,0)
    Syndrome: $S=X'H^T=(1,0,0)$
    Error vector: (1,0,0,0,0,0,0)
    After correction: (0,0,0,0,0,0,0)

TABLE 35

|  | Vertical 0 | Vertical 1 | Vertical 2 | Vertical 3 |  |  |  |
|---|---|---|---|---|---|---|---|
| Horizontal 0 | 0 | 1 | 1 | 1 | 1 | 0 | 0 |
| Horizontal 1 | 0 | 0 | 0 | 0 | 0 | 0 | 0 |
| Horizontal 2 | 0 | 0 | 0 | 0 | 0 | 0 | 0 |
| Horizontal 3 | 0 | 0 | 0 | 0 | 0 | 0 | 0 |
|  | 0 | 0 | 0 | 0 |  |  |  |
|  | 0 | 0 | 0 | 0 |  |  |  |
|  | 0 | 0 | 0 | 0 |  |  |  |

(6) Error correction processing in the vertical direction is performed. The result shown in Table 36 is obtained.

Vertical 0 X'=(0,0,0,0,0,0,0)
    Syndrome: $S=X'H^T=(0,0,0)$
    No error

Vertical 1 X'=(1,0,0,0,0,0,0)
    Syndrome: $S=X'H^T=(1,0,0)$
    Error vector: (1,0,0,0,0,0,0)
    After correction: (0,0,0,0,0,0,0)

Vertical 2 X'=(1,0,0,0,0,0,0)
    Syndrome: $S=X'H^T=(1,0,0)$
    Error vector: (1,0,0,0,0,0,0)
    After correction: (0,0,0,0,0,0,0)

Vertical 3 X'=(1,0,0,0,0,0,0)
    Syndrome: $S=X'H^T=(1,0,0)$
    Error vector: (1,0,0,0,0,0,0)
    After correction: (0,0,0,0,0,0,0)

TABLE 36

|  | Vertical 0 | Vertical 1 | Vertical 2 | Vertical 3 |  |  |  |
|---|---|---|---|---|---|---|---|
| Horizontal 0 | 0 | 0 | 0 | 0 | 1 | 0 | 0 |
| Horizontal 1 | 0 | 0 | 0 | 0 | 0 | 0 | 0 |
| Horizontal 2 | 0 | 0 | 0 | 0 | 0 | 0 | 0 |
| Horizontal 3 | 0 | 0 | 0 | 0 | 0 | 0 | 0 |
|  | 0 | 0 | 0 | 0 |  |  |  |
|  | 0 | 0 | 0 | 0 |  |  |  |
|  | 0 | 0 | 0 | 0 |  |  |  |

(7) Error correction processing in the horizontal direction is performed again. The result shown in Table 37 is obtained.

Horizontal 0 X'=(0,0,0,0,1,0,0)
  Syndrome: S=X'H$^T$=(1,0,1)
  Error vector: (0,0,0,0,1,0,0)
  After correction: (0,0,0,0,0,0,0)
Horizontal 1 X'=(0,0,0,0,0,0,0)
  Syndrome: S=X'H$^T$=(0,0,0)
  No error
Horizontal 2 X'=(1,0,0,0,0,0,0)
  Syndrome: S=X'H$^T$=(0,0,0)
  No error
Horizontal 3 X'=(1,0,0,0,0,0,0)
  Syndrome: S=X'H$^T$=(0,0,0)
  No error

TABLE 37

|  | Vertical 0 | Vertical 1 | Vertical 2 | Vertical 3 |  |  |  |
|---|---|---|---|---|---|---|---|
| Horizontal 0 | 0 | 0 | 0 | 0 | 0 | 0 | 0 |
| Horizontal 1 | 0 | 0 | 0 | 0 | 0 | 0 | 0 |
| Horizontal 2 | 0 | 0 | 0 | 0 | 0 | 0 | 0 |
| Horizontal 3 | 0 | 0 | 0 | 0 | 0 | 0 | 0 |
|  | 0 | 0 | 0 | 0 |  |  |  |
|  | 0 | 0 | 0 | 0 |  |  |  |
|  | 0 | 0 | 0 | 0 |  |  |  |

(8) Error correction processing in the vertical direction is performed.

Vertical 0 X'=(0,0,0,0,0,0,0)
  Syndrome: S=X'H$^T$=(0,0,0)
  No error
Vertical 1 X'=(0,0,0,0,0,0,0)
  Syndrome: S=X'H$^T$=(0,0,0)
  No error
Vertical 2 X'=(0,0,0,0,0,0,0)
  Syndrome: S=X'H$^T$=(0,0,0)
  No error
Vertical 3 X'=(0,0,0,0,0,0,0)
  Syndrome: S=X'H$^T$=(0,0,0)
  No error Since all syndromes are (0,0,0), it is confirmed that all errors in the vertical direction are corrected.

(9) Next, error correction processing in the horizontal direction is performed.

Horizontal 0 X'=(0,0,0,0,0,0,0)
  Syndrome: S=X'H$^T$=(0,0,0)
  No error
Horizontal 1 X'=(0,0,0,0,0,0,0)
  Syndrome: S=X'H$^T$=(0,0)
  No error
Horizontal 2 X'=(0,0,0,0,0,0,0)
  Syndrome: S=X'H$^T$=(0,0,0)
  No error
Horizontal 3 X'=(0,0,0,0,0,0,0)
  Syndrome: S=X'H$^T$=(0,0,0)
  No error Since all syndromes are (0,0,0), it is confirmed that all errors in the horizontal direction are corrected.

(10) Since all errors in the vertical and horizontal directions are corrected, error correction processing is ended.

As is apparent from the above description, according to the present invention, the maximum number of bits capable of error correction equals to that of the prior art although the coding rate is equal to that of the prior art. Even an error pattern for which error correction cannot be performed in the prior art can be corrected, so the error correction probability can be increased.

In the present invention, when CRC is performed in units of a plurality of horizontal line blocks or for all data, as in the prior art, decoding processing can be performed at a high speed.

In the present invention, error correction can be performed while estimating error bits or error symbols from a plurality of error blocks, so reliable error correction can be executed for various multi-dimensional codes.

In the present invention, the error correction processing ability can be improved as compared to the prior art.

What is claimed is:

1. An error correction coding method comprising segmenting continuous transmission data in units of predetermined lengths, rearranging the data parallelly, and performing error correction coding processing for each of horizontal line blocks and vertical line blocks of the rearranged transmission data.

2. A method according to claim 1, further comprising adding a first check bit to the horizontal line block, and a second check bit to the vertical line block.

3. A method according to claim 2, further comprising adding the second check bit to the first check bit.

4. A method according to claim 2, further comprising adding the first check bit to the second check bit.

5. A method according to claim 1, further comprising performing cyclic redundancy coding processing before error correction coding processing.

6. A method according to claim 1, wherein error correction coding processing is performed for multi-dimensional data, the number of dimensions of which is not less than three.

7. A method according to claim 6, further comprising performing cyclic redundancy coding processing before a first error correction coding processing.

8. A method according to claim 1, wherein a code used in error correction coding processing is a redundant code including a Hamming code, a BCH code, and a Reed-Solomon code.

9. An error correction decoding method comprising segmenting received data in units of predetermined lengths, rearranging the data parallelly, and performing error correction decoding processing for each of horizontal line blocks and vertical line blocks of the rearranged data.

10. A method according to claim 9, further comprising performing cyclic redundancy error detection processing after error correction decoding processing.

11. A method according to claim 9, wherein error correction decoding processing is performed for multi-dimensional data, the number of dimensions of which is not less than three.

12. A method according to claim 11, further comprising performing cyclic redundancy error detection processing before a final error correction decoding processing.

13. A method according to claim 11, further comprising performing cyclic redundancy error detection processing before error correction decoding processing.

14. A method according to claim 9, wherein a code used in error correction decoding processing is a redundant code including a Hamming code, a BCH code, and a Reed-Solomon code.

15. A method according to claim 14, wherein error correction decoding processing comprises performing error correction by processing a symbol at which a horizontal line block and a vertical line block cross, for which symbol error correction of a Reed-Solomon code cannot be performed, as error symbol position information.

16. An error correction coding/decoding method comprising:
- performing error correction coding processing of segmenting continuous transmission data in units of predetermined lengths, rearranging the data parallelly, and performing error correction coding processing for each of horizontal line blocks and vertical line blocks of the rearranged transmission data; and
- performing error correction decoding processing of segmenting received data in units of predetermined lengths, rearranging the data parallelly, and performing error correction decoding processing for each of horizontal line blocks and vertical line blocks of the rearranged data.

17. An error correction coding apparatus comprising an error correction encoder for segmenting continuous transmission data in units of predetermined lengths, rearranging the data parallelly, and performing error correction coding processing for each of horizontal line blocks and vertical line blocks of the rearranged transmission data.

18. An apparatus according to claim 17, wherein said error correction encoder adds a first check bit to the horizontal line block, and a second check bit to the vertical line block.

19. An apparatus according to claim 18, wherein said error correction encoder adds the second check bit to the first check bit.

20. An apparatus according to claim 18, wherein said error correction encoder adds the first check bit to the second check bit.

21. An apparatus according to claim 17, further comprising a CRC coding circuit for performing cyclic redundancy coding processing before error correction coding processing.

22. An apparatus according to claim 17, further comprising an error correction coding circuit for performing error correction coding processing for multi-dimensional data, the number of dimensions of which is not less than three.

23. An apparatus according to claim 22, further comprising a CRC coding circuit for performing cyclic redundancy coding processing before a first error correction coding processing.

24. An apparatus according to claim 17, wherein a code used in error correction coding processing is a redundant code including a Hamming code, a BCH code, and a Reed-Solomon code.

25. An error correction decoding apparatus comprising an error correction decoder for segmenting received data in units of predetermined lengths, rearranging the data parallelly, and performing error correction decoding processing for each of horizontal line blocks and vertical line blocks of the rearranged data.

26. An apparatus according to claim 25, further comprising a CRC error detection circuit for performing cyclic redundancy error detection processing after error correction decoding processing.

27. An apparatus according to claim 25, further comprising an error correction decoding circuit for performing error correction decoding processing for multi-dimensional data, the number of dimensions of which is not less than three.

28. An apparatus according to claim 27, further comprising a CRC error detection circuit for performing cyclic redundancy error detection processing before the final error correction decoding circuit.

29. An apparatus according to claim 27, further comprising a CRC error detection circuit arranged before said error correction decoding circuits to perform cyclic redundancy error detection processing.

30. An apparatus according to claim 25, wherein a code used in error correction decoding processing is a redundant code including a Hamming code, a BCH code, and a Reed-Solomon code.

31. An apparatus according to claim 30, wherein said error correction decoder performs error correction by processing a symbol at which a horizontal line block and a vertical line block cross, for which symbol error correction of a Reed-Solomon code cannot be performed, as error symbol position information.

32. An error correction coding/decoding apparatus comprising:
- an error correction encoder for segmenting continuous transmission data in units of predetermined lengths, rearranging the data parallelly, and performing error correction coding processing for each of horizontal line blocks and vertical line blocks of the rearranged transmission data; and
- an error correction decoder for segmenting received data in units of predetermined lengths, rearranging the data parallelly, and performing error correction decoding processing for each of horizontal line blocks and vertical line blocks of the rearranged data.

* * * * *